(12) United States Patent
Kato et al.

(10) Patent No.: US 8,081,119 B2
(45) Date of Patent: Dec. 20, 2011

(54) PRODUCT INCLUDING POWER SUPPLY CIRCUIT BOARD

(75) Inventors: Noboru Kato, Moriyama (JP); Ikuhei Kimura, Nara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 612 days.

(21) Appl. No.: 12/234,949

(22) Filed: Sep. 22, 2008

(65) Prior Publication Data

US 2009/0009007 A1 Jan. 8, 2009

Related U.S. Application Data

(63) Continuation of application No. PCT/JP2007/057959, filed on Apr. 11, 2007.

(30) Foreign Application Priority Data

Apr. 26, 2006 (JP) .................................. 2006-122487
Oct. 19, 2006 (JP) .................................. 2006-285062

(51) Int. Cl.
*H01Q 1/38* (2006.01)
(52) U.S. Cl. .................. 343/700 MS; 343/820; 343/850
(58) Field of Classification Search ........... 343/700 MS, 343/80, 820, 850, 860
See application file for complete search history.

(56) References Cited

U.S. PATENT DOCUMENTS

| | | | |
|---|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Matloubian et al. |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |

(Continued)

FOREIGN PATENT DOCUMENTS

EP 0 977 145 A2 2/2000

(Continued)

OTHER PUBLICATIONS

English translation of NL9100176, published on Mar. 2, 1992.

(Continued)

*Primary Examiner* — Dieu H Duong
(74) *Attorney, Agent, or Firm* — Keating & Bennett, LLP

(57) ABSTRACT

A product includes a power supply circuit board, which includes a power supply circuit having a stable frequency characteristic which enables communication among various products to be obtained. The product includes a power supply circuit board including a power supply circuit arranged thereon having an inductance element, and a wireless communication circuit board electrically connected to the power supply circuit. The wireless communication circuit board is mounted on the power supply circuit board. The product further includes a radiation plate which emits a transmission signal which is supplied from the power supply circuit through electromagnetic field coupling and which has a frequency substantially determined in accordance with a resonant frequency of the power supply circuit, and which is used to supply a reception signal to the power supply circuit through electromagnetic field coupling.

19 Claims, 25 Drawing Sheets

U.S. PATENT DOCUMENTS

| | | |
|---|---|---|
| 6,172,608 B1 | 1/2001 | Cole |
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,500,610 B1 * | 3/2009 | Hadley et al. ............. 235/451 |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2004/0001027 A1 | 1/2004 | Killen et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0252700 A1 | 11/2007 | Ishihara et al. |
| 2007/0285335 A1 | 12/2007 | Bungo et al. |
| 2008/0024156 A1 | 1/2008 | Arai et al. |
| 2008/0169905 A1 | 7/2008 | Slatter |
| 2008/0272885 A1 | 11/2008 | Atherton |
| 2009/0002130 A1 | 1/2009 | Kato |

FOREIGN PATENT DOCUMENTS

| | | |
|---|---|---|
| EP | 1 439 608 A1 | 7/2004 |
| JP | 50-143451 A | 11/1975 |
| JP | 62-127140 U | 8/1987 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 10-505466 A | 5/1998 |
| JP | 10-171954 A | 6/1998 |
| JP | 10-293828 A | 11/1998 |
| JP | 11-149538 A | 6/1999 |
| JP | 11-219420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2001-028036 A | 1/2001 |
| JP | 2007-18067 A | 1/2001 |
| JP | 2001-66990 A | 3/2001 |
| JP | 2001-168628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2002-024776 A | 1/2002 |
| JP | 2002-042076 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-230128 A | 8/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2003-016412 A | 1/2003 |
| JP | 2003-030612 A | 1/2003 |
| JP | 2003-44789 A | 2/2003 |
| JP | 2003-58840 A | 2/2003 |
| JP | 2003-067711 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-179426 A | 6/2003 |
| JP | 2003-187207 A | 7/2003 |
| JP | 2003-187211 A | 7/2003 |
| JP | 2003-198230 A | 7/2003 |
| JP | 2003-209421 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-288560 A | 10/2003 |

| | | | |
|---|---|---|---|
| JP | 2003-309418 A | 10/2003 |
| JP | 2003-332820 A | 11/2003 |
| JP | 2004-88218 A | 3/2004 |
| JP | 2004-096566 A | 3/2004 |
| JP | 2004-253858 A | 9/2004 |
| JP | 2004-287767 A | 10/2004 |
| JP | 2004-297249 A | 10/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-136528 A | 5/2005 |
| JP | 2005-165839 A | 6/2005 |
| JP | 2005-167327 A | 6/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-275870 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-039902 A | 2/2006 |
| JP | 2006-67479 A | 3/2006 |
| JP | 2006-067479 A | 3/2006 |
| JP | 2006-72706 A | 3/2006 |
| JP | 2006-072706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-195795 A | 7/2006 |
| JP | 2006-270212 A | 10/2006 |
| JP | 2006-309401 A | 11/2006 |
| JP | 2007-65822 A | 3/2007 |
| JP | 2007-150868 A | 6/2007 |
| JP | 11-175678 A | 1/2009 |
| KR | 2000-0024634 A | 5/2000 |
| NL | 9100176 A | 3/1992 |
| NL | 9100347 A | 3/1992 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115489 A1 | 12/2005 |
| WO | 2005/115849 A1 | 12/2005 |
| WO | 2006/045682 A | 5/2006 |

OTHER PUBLICATIONS

English translation of NL9100347, published on Mar. 2, 1992.
Kato et al.: "Antenna," U.S. Appl. No. 11/928, 502, filed Oct. 30, 2007.
Kato et al.: "Wireless IC Device," U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Dokai et al.: "Wireless IC Device and Component for Wireless IC Device," U.S. Appl. No. 12/359,690, filed Jan. 26, 2009.
Kato et al.: "Data Coupler," U.S. Appl. No. 12/252,475, filed Oct. 16, 2008.
Kato et al.; "Information Terminal Device," U.S. Appl. No. 12/267,666, filed Nov. 10, 2008.
Kato et al.: "Wireless IC Device and Wireless IC Device Composite Component," U.S. Appl. No. 12/276,444, filed Nov. 24, 2008.
Dokai et al.: "Optical Disc," U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400, filed Nov. 20, 2008.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Kato et al.: "Wireless IC Device and Component for Wireless IC Device," U.S. Appl. No. 12/339,198, filed Dec. 19, 2008.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed Jan. 8, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2007/057959, mailed on Jul. 17, 2007.
Kato et al.: "Electromagnetic-Coupling-Module-Attached Article," U.S. Appl. No. 11/740,509, filed Apr. 26, 2007.
Official Communication issued in corresponding Japanese Patent Application No. 2008-513098, mailed on Oct. 12, 2010.
Official Communication issued in corresponding European Patent Application No. 07741395.3, mailed on Mar. 10, 2010.

* cited by examiner

PRODUCT INCLUDING POWER SUPPLY CIRCUIT BOARD

BACKGROUND OF THE INVENTION

1. Field of the Invention

The present invention relates to products including power supply circuit boards, and particularly, relates to a product which includes a power supply circuit board having a power supply circuit electrically connected to a wireless communication circuit and which is used in an RFID (Radio Frequency Identification) system.

2. Description of the Related Art

In general, as a product management system, an RFID system includes a reader/writer which generates an induction field, and an IC tag (hereinafter referred to as a "wireless IC device") which stores therein predetermined information regarding a product. This information is communicated between the reader/writer and the IC tag in a non-contact manner so that the information is transmitted. Examples of a wireless IC device used in an RFID system include devices disclosed in Japanese Unexamined Patent Application Publication No. 2005-136528 and Publication No. 2005-244778.

Specifically, a device including a plastic film 600, an antenna pattern 601 arranged on the plastic film 600, and a wireless IC chip 610 arranged on one end of the antenna pattern 601 as shown in FIG. 51, and a device including a plastic film 620, an antenna pattern 621 arranged on the plastic film 620, radiating electrodes 622 arranged on the plastic film 620, and a wireless IC chip 610 arranged on a predetermined portion of the antenna pattern 621 as shown in FIG. 52 have been proposed.

However, in the wireless IC devices in the related art, because the wireless IC chip 610 is arranged on each of the antenna patterns 601 and 621 using an Au bump so as to be electrically connected to each of the antenna patterns 601 and 621, the fine wireless IC chip 610 should be positioned on each of the films 600 and 620 having large areas. However, it is considerably difficult to implement the fine wireless IC chip 610 on each of the films 600 and 620 having large areas. That is, there arises a problem in that if positional deviation is generated in implementation, resonant frequency characteristics of the antennas can be changed. Furthermore, the resonant frequency characteristics of the antennas are also changed when the antenna pattern 601 and 621 are rolled or sandwiched between dielectric bodies (when the antenna pattern 601 or 621 is inserted into a book, for example).

Although the possibilities for use of such a wireless IC device are infinite, it is still difficult to arrange the wireless IC device on various products since resonant frequency characteristics are changed in accordance with an arrangement state of an antenna.

SUMMARY OF THE INVENTION

In order to overcome the problems described above, preferred embodiments of the present invention provide a product including a power supply circuit board which has a power supply circuit having stable frequency characteristics and which enables communication among various types of products (or devices).

A product including a power supply circuit board according to a preferred embodiment of the present invention includes a power supply circuit board with a power supply circuit mounted thereon having an inductance element, a wireless communication circuit board which is electrically connected to the power supply circuit, wherein one of the power supply circuit board and the wireless communication circuit board is mounted on the other or the power supply circuit board and the wireless communication circuit board are integrally formed as a board, and the other board or an integrally formed board is mounted on the product, and the product includes a radiation plate having at least one of two functions, i.e., a function of emitting a transmission signal which is supplied from the power supply circuit through electromagnetic field coupling and which has a frequency substantially determined in accordance with a resonant frequency of the power supply circuit, and a function of supplying a reception signal to the power supply circuit through the electromagnetic field coupling.

In the product including the power supply circuit board according to the preferred embodiments of the present invention, the wireless communication circuit board is electrically connected to the power supply circuit board. Because the power supply circuit board is disposed on the product, the power supply circuit board and the radiation plate are connected to each other through an electromagnetic field connection. A frequency of the transmission signal emitted from the radiation plate and a frequency of a reception signal to be supplied to the wireless communication circuit board are substantially determined in accordance with the resonant circuit of the power supply circuit in the power supply circuit board. Here, these frequencies are "substantially" determined because the frequencies will shift slightly due to the positional relationship between the power supply circuit board and the radiation plate. That is, since the frequency of the transmission signal and the reception signal are determined by the power supply circuit board connected to the wireless communication circuit board, frequency characteristics are not changed due to a shape, a size and an arrangement position of the radiation plate, that is, frequency characteristics are not changed even when the radiation plate is rolled or is sandwiched between dielectric bodies. Accordingly, stable frequency characteristics are attained. Consequently, communication among various products (devices) is achieved.

In the product including the power supply circuit board according to a preferred embodiment of present invention, the radiation plate may be a metallic member originally included in the product. For example, a metallic body of an automobile serving as the product may be used as the radiation plate, and a metallic case of a mobile terminal device serving as the product may be used as the radiation plate. Furthermore, the radiation plate may be a metallic plate which is disposed on the product so as to serve as the radiation plate.

In the product including the power supply circuit board according to a preferred embodiment of present invention, the power supply circuit may be a lumped constant resonant circuit including a capacitance element and an inductance element. The lumped constant resonant circuit may be an LC series resonant circuit or an LC parallel resonant circuit. Alternatively, the lumped constant resonant circuit may include a plurality of LC series resonant circuits or a plurality of LC parallel resonant circuits. The resonant circuit may include a distributed constant resonant circuit, and in this case, an inductor included in the resonant circuit is formed of a strip line. However, if the lumped constant resonant circuit including a capacitance element and an inductance element is used, a reduced size is attained and the resonant circuit is prevented from being influenced by other elements such as the radiation plate. If a plurality of resonant circuits are used and are connected to one another, wideband signals are attained.

When the capacitance element is arranged between the wireless communication circuit board and the inductance element, a surge resistance property is improved. Since a surge is low frequency current up to 200 MHz, the surge is cut using the capacitance element, and the wireless communication circuit board is prevented from being destroyed by the surge.

The power supply circuit board may be a multilayer board including a plurality of dielectric or magnetic layers laminated to one another, and in this case, the capacitance element and the inductance element are arranged on a surface of the multilayer board or inside the multilayer board. When the power supply circuit board corresponds to the multilayer board, the elements (such as electrodes) included in the resonant circuit may be arranged on the surface of the board or inside the board. Accordingly, a miniaturization of the board is attained. Furthermore, a degree of freedom of arrangement of the elements included in the resonant circuit is enhanced, and capability of the resonant circuit is improved. The multilayer board may be a resin multilayer board including a plurality of resin films laminated to one another or a ceramic multilayer board including a plurality of ceramic films laminated to one another. Alternatively, the multilayer board may be a thin film multilayer board generated using a thin film formation technique. When the ceramic multilayer board is used, the ceramic films are preferably formed of low temperature sintered ceramic material. Silver or copper having low resistance is preferably used for the resonant circuit member when the ceramic films are formed of low temperature sintered ceramic material.

The power supply circuit board may be a dielectric or magnetic single layer board. In this case, at least one of the capacitance element and the inductance element is arranged on a surface of the single layer board. The single layer board may be formed of resin or ceramic. The capacitance element may be arranged between flat electrodes arranged on front and back surfaces of the single layer board, and alternatively, may be arranged between electrodes arranged on one surface of the single layer board.

The power supply circuit board is preferably a rigid resin board or a rigid ceramic board. In this case, since the board is rigid, a stable frequency of the transmission signal is attained whenever the power supply circuit board is attached to a portion having any shape in the product. In addition, the wireless communication circuit board is stably mounted on the rigid board.

The radiation plate is preferably an electrode having a band shape, and a length of the band shaped electrode is preferably equal to the integral multiple of a half wavelength of the resonant frequency so that a maximum gain is obtained. Note that, since the frequency is substantially determined by the resonant circuit, the length of the radiation plate is not necessarily be equal to the integral multiple of a half wavelength of the resonant frequency. This is a great advantage when compared with a case where the radiation plate is an antenna element having a specific resonant frequency.

Furthermore, the wireless communication circuit board and the power supply circuit board may be connected through various methods. For example, an electrode on a wireless communication circuit board side may be arranged on the wireless communication circuit board serving as a first board, an electrode on a first board side may be arranged on the power supply circuit board, and the wireless communication circuit board and the electrode on the first board side may be electrically connected to each other. In this case, solder, conductive resin, or gold bumps may be used for the connection.

Alternatively, the electrode on the wireless communication circuit board side and the electrode on the first board side may be electrically connected to each other by capacitance coupling or magnetic field coupling. When the capacitance coupling or the magnetic field coupling is used, solder or conductive resin is not required for the connection, and an adhesive agent, such as resin, can be used for bonding. In this case, the electrode on the wireless communication circuit board side and the electrode on the first board side are not required to be arranged on a surface of the wireless communication circuit board and a surface of the power supply circuit board, respectively. For example, a resin film may be formed on the surface of the wireless communication circuit board, or the electrode on the first board side may be arranged in an inner layer of the multilayer board.

When capacitance coupling is used, an area of the electrode on the first substrate side is preferably larger than an area of the electrode on the wireless communication circuit board side. By this arrangement, even if positional accuracy is deteriorated when the wireless communication circuit board is mounted on the power supply circuit board, variation of a capacitance generated between the electrodes can be reduced. Furthermore, even though it is difficult to arrange an electrode having a large area on the small wireless communication circuit board, the electrode having a large area is readily arranged on the comparatively large power supply circuit board.

When magnetic field coupling is used, when compared with the capacitance coupling, a considerably high mounting accuracy of the wireless communication circuit board onto the power supply circuit board is not required, and accordingly, mounting thereof is further facilitated. Moreover, the electrode on the wireless communication circuit board side and the electrode on the first board side are preferably electrodes having coil shapes. A spiral electrode or a helical electrode is readily designed as such a coil electrode. A meandering electrode may be effectively used for high frequencies.

In addition, the power supply circuit board and the radiation plate serving as a second board may be connected with each other using various methods. For example, an electrode on a second board side and the radiation plate 20 may be connected to each other through capacitance coupling or magnetic field coupling. When the capacitance coupling or the magnetic field coupling is used, solder or conductive resin is not required for the connection, and an adhesive agent, such as resin, preferably is used for bonding. In this case, the electrode on the second board side is not required to be arranged on a surface of the power supply circuit board and a surface of the power supply circuit board, respectively. For example, the electrode on the second board side may be arranged in an inner layer of the multilayer board.

When magnetic field coupling is used, the electrode on the second board side is preferably an electrode having a coil shape. A spiral electrode or a helical electrode is readily designed as such a coil electrode. A meandering electrode may be effectively used for high frequencies. Note that, when the magnetic field coupling is used, it is preferable not to prevent a change of magnetic flux generated in the electrode on the second board side (coil electrode), and therefore, opening portions are preferably formed on the radiation plate, for example. By this, transmission efficiency of signal energy is improved, and shifts of frequencies generated due to the bonding are reduced.

According to the preferred embodiments of present invention, since frequencies of a transmission signal and a reception signal are determined by a power supply circuit arranged on a power supply circuit board, even when the power supply circuit board is used in combination with any radiation plate of any configuration frequency characteristics are not changed and stable frequency characteristics are attained.

Furthermore, the power supply circuit board is mounted on the wireless communication circuit board with considerably high accuracy. Accordingly, communication among various products (devices) is achieved by utilizing metallic bodies originally included in the products themselves or metallic plates disposed on the products as radiation plates.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1A:
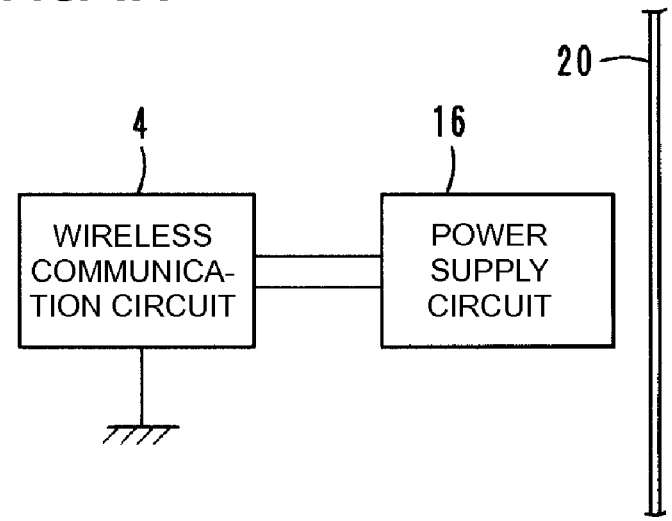
FIGS. 1A and 1B are block diagrams illustrating basic configurations of a power supply circuit and a wireless communication circuit which are included in a product according to preferred embodiments of present invention.

Preferred embodiments of a product including a power supply circuit board according to the present invention will be described hereinafter with reference to the accompanying drawings. Note that components used in various wireless communication circuit boards, various power supply circuit boards, and various products in common are denoted by identical reference numerals, and therefore, redundant descriptions thereof are omitted.

Figure 1B:
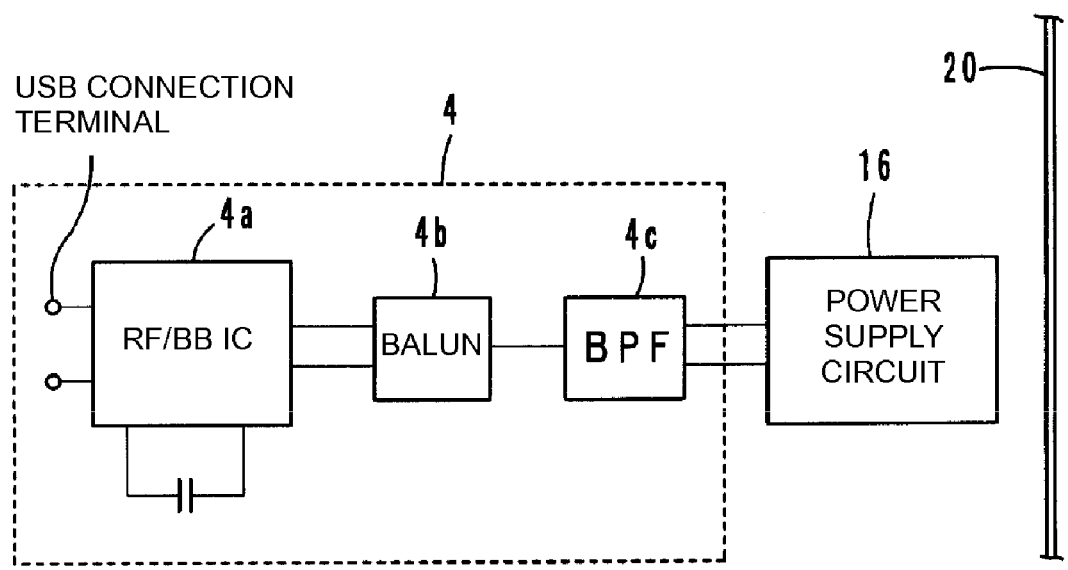

Basic Circuit Configuration (Refer to FIGS. 1A and 1B)

FIG. 1A shows a basic circuit configuration of a product including a power supply circuit board according to a preferred embodiment of the present invention in which a power supply circuit 16 is electrically connected to a wireless communication circuit (for example, a modem) 4 and is electromagnetically connected to a radiation plate 20. The radiation plate 20 is a metallic body originally included in each of various products which will be described in preferred embodiments below or a metallic plate disposed on each of the various products.

The wireless communication circuit 4 is mounted on a cellular phone, for example, and includes an RF unit which transmits and receives a high frequency signal and a BB unit which converts the high frequency signal into a baseband signal. Note that an IC for signal processing and components such as an inductor, a capacitor, filter, etc., are preferably provided in order to process a signal using the RF unit and the BB unit. The IC and the components are implemented on a predetermined board or are incorporated in a predetermined board whereby the wireless communication circuit 4 is configured. As shown in FIG. 1B, a Bluetooth communication circuit, for example, which is one of near field communication systems includes an RF/BB IC 4a which is an IC for radio communication and for signal processing, a balun 4b which is a balanced-to-unbalanced transformer, and a bandpass filter (BPF) 4c, and is configured as a wireless communication circuit board in which these components are implemented thereon or incorporated therein. The power supply circuit 16 includes a resonant circuit having an inductance element, which will be described hereinafter, and is configured as a power supply circuit board. Furthermore, the wireless communication circuit 4 has a function of transmitting a signal to and receiving a signal from a reader/writer through the power supply circuit 16.

Combination of Wireless Communication Circuit Board and Power Supply Circuit Board (Refer to FIGS. 2 to 5)

Figure 2:
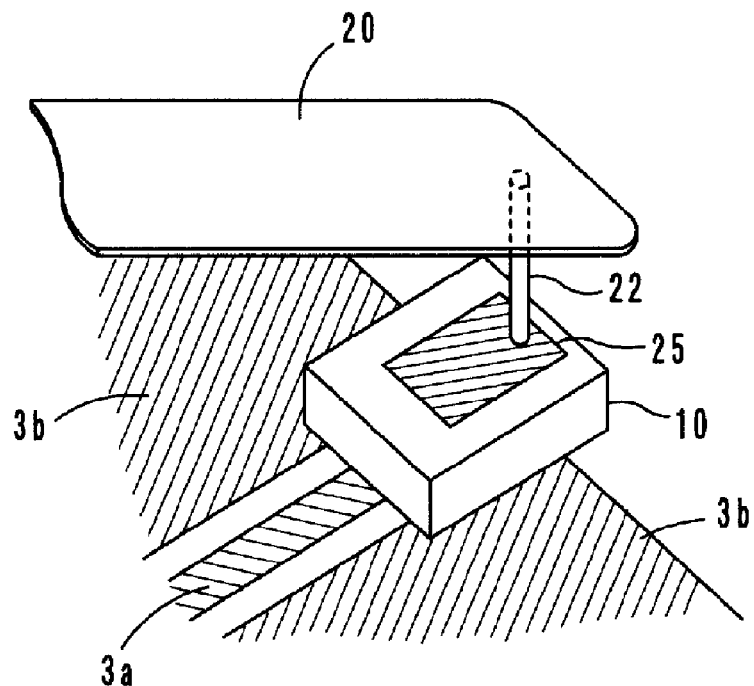
FIG. 2 is a perspective view illustrating a first example of a preferred embodiment of a combination of a wireless communication circuit board and a power supply circuit board.

FIG. 2 shows a first preferred embodiment of a combination of the wireless communication circuit board and the power supply circuit board. In FIG. 2, an electrode arranged on a back surface of a power supply circuit board 10 including the power supply circuit 16 is connected to an electrode 3a arranged on the wireless communication circuit board by soldering, for example, so as to be connected to the wireless communication circuit 4. The power supply circuit 16 is connected through electromagnetic field coupling to the radiation plate 20 through an electrode 25 and a conductor 22 which are arranged on a surface of the power supply circuit board 10. A reference numeral 3b denotes a ground electrode. Note that the electrode 25 and the conductor 22 or the radiation plate 20 and the conductor 22 may be electrically connected to each other by soldering or using a dielectric adhesive agent, or may be electrically insulated from each other using an insulation adhesive agent.

Figure 3:
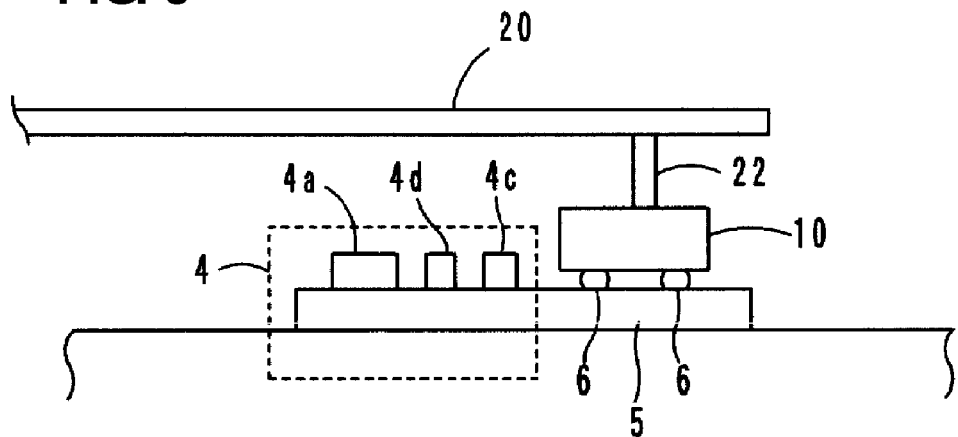
FIG. 3 is a side view illustrating a second example of a preferred embodiment of the combination of the wireless communication circuit board and the power supply circuit board.

FIG. 3 shows a second combination example of a preferred embodiment in which the IC 4a, the BPF 4c, and the capacitor 4d are arranged on a board 5 so as to configure the wireless communication circuit 4. The balun 4b (as seen in FIG. 1B) is incorporated in the board 5. Furthermore, the power supply circuit board 10 including the power supply circuit 16 is connected to the board 5 using soldering bumps 6. Other configurations are the same as those of the first combination example.

Figure 4:
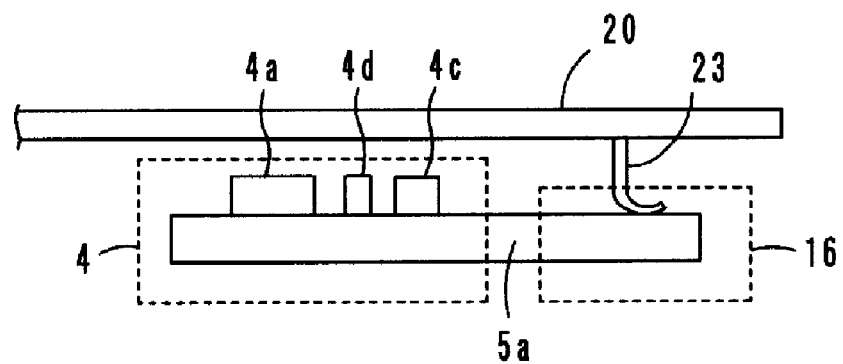
FIG. 4 is a side view illustrating a third example of a preferred embodiment of the combination of the wireless communication circuit board and the power supply circuit board.

FIG. 4 shows a third combination example of a preferred embodiment in which the wireless communication circuit 4 and the power supply circuit 16 are integrally arranged on a board 5a. The power supply circuit 16 is connected through electromagnetic field connection to the radiation plate 20 through a conductor 23 which has a spring characteristic and which is pressure bonded on the board 5a. Other configurations are preferably the same as those of the second combination example. Note that, as with the first combination example, the radiation plate 20 and the conductor 23 may be electrically connected to each other by soldering or using a dielectric adhesive agent, or may be electrically insulated from each other using an insulation adhesive agent.

Figure 5:
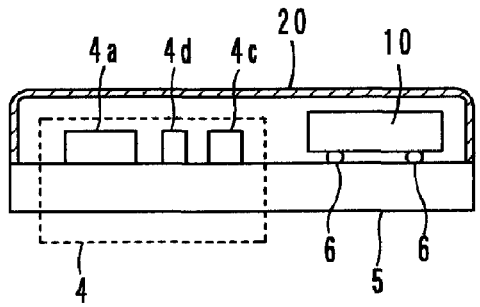
FIG. 5 is a sectional view illustrating a fourth example of a preferred embodiment of the combination of the wireless communication circuit board and the power supply circuit board.

FIG. 5 shows a fourth combination example of a preferred embodiment in which the power supply circuit 16 included in the power supply circuit board 10 arranged on the board 5 is connected through electromagnetic field connection to the radiation plate 20 (for example, a metal case) fixedly arranged on the board 5. Other configurations are the same as those of the second combination example.

First Example of Electromagnetic Coupling Module (Refer to FIGS. 6 to 11)

Figure 6:
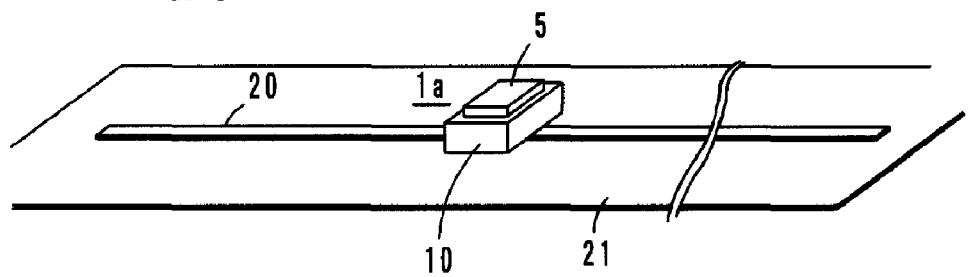
FIG. 6 is a perspective view illustrating a first example of a preferred embodiment of an electromagnetic coupling module.
Figure 7:
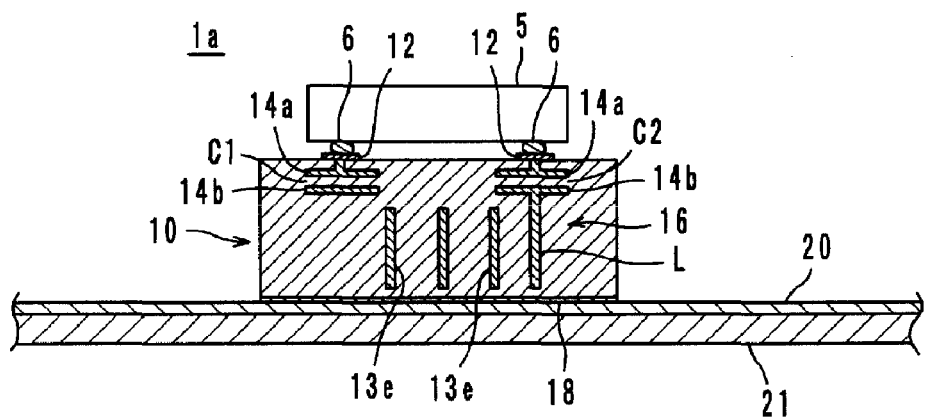
FIG. 7 is a sectional view illustrating the first example of a preferred embodiment of the present invention.

An electromagnetic coupling module 1a according to a first example of a preferred embodiment operates in combination with a monopole radiation plate 20. As shown in FIGS. 6 and 7, the electromagnetic coupling module 1a includes a wireless communication circuit board 5 and the power supply circuit board 10 including the circuit board 5 mounted thereon, and is bonded to the radiation plate 20 which is an electrode having a band shape. The wireless communication circuit board 5 includes the wireless communication circuit 4 shown in FIG. 1B and is electrically connected to the power supply circuit 16 incorporated in the power supply circuit board 10.

The power supply circuit 16 is used to supply a transmission signal having a predetermined frequency to the radiation plate 20 and/or used to select a reception signal having a predetermined frequency from among signals received using the radiation plate 20 so as to supply the selected signal to the wireless communication circuit board 5. The power supply circuit 16 includes a resonant circuit which resonates with the frequencies of the transmission signal and the reception signal.

Figure 8:
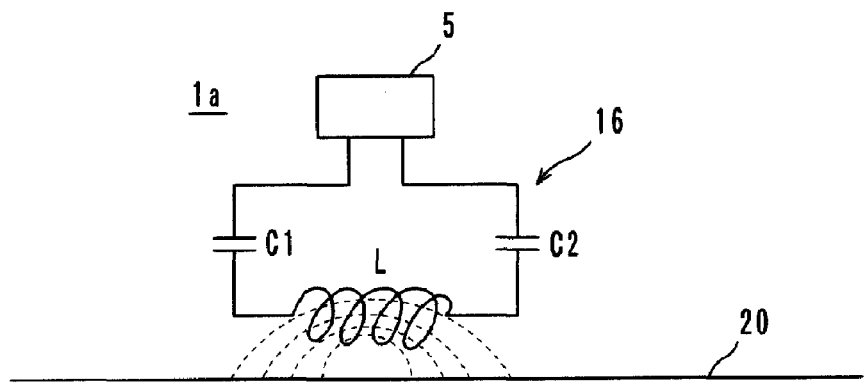
FIG. 8 is a diagram illustrating an equivalent circuit of the first example of a preferred embodiment of the present invention.
Figure 9:
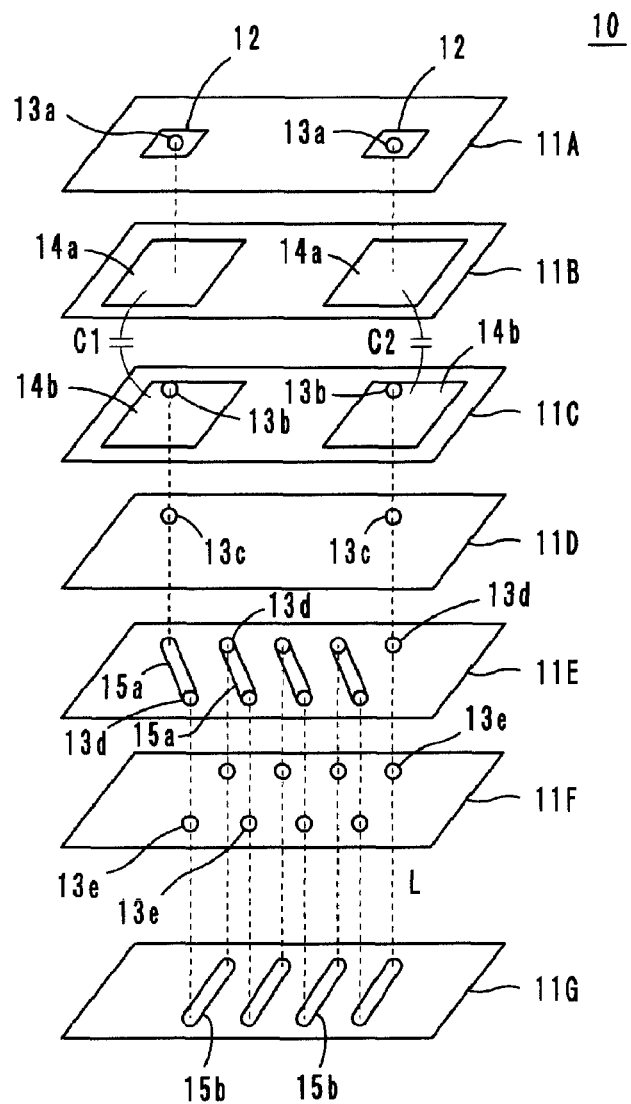
FIG. 9 is an exploded perspective view illustrating the power supply circuit board of the first example of a preferred embodiment of the present invention.

The power supply circuit board 10 includes the power supply circuit 16 configured as a lumped constant (LC) series resonant circuit including a helical inductance element L and capacitance elements C1 and C2 as shown in FIGS. 7 and 8. As shown in an exploded perspective view in FIG. 9 in detail, the power supply circuit board 10 includes ceramic sheets 11A to 11G which are laminated and pressure bonded with one another, and sintered, for example. The sheet 11A includes connection electrodes 12 and via-hole conductors 13a, the sheet 11B includes capacitor electrodes 14a, the sheet 11C includes capacitor electrodes 14b and via-hole conductors 13b, the sheet 11D includes via-hole conductors 13c, the sheet 11E includes inductor electrodes 15a and via-hole conductors 13d, the sheet 11F (a single or a plurality of sheets 11F) includes via-hole conductors 13e, and the sheet 11G includes inductor electrodes 15b. Note that each of the ceramic sheets 11A to 11G may be formed of a magnetic ceramic member, and the power supply circuit board 10 is more readily obtained by general processing of manufacturing a multilayer substrate, such as a sheet lamination method or a thick film printing method.

By laminating the sheets 11A to 11G, the inductance element L having an axis of helical winding substantially parallel to the radiation plate 20 is connected to the capacitor electrodes 14b arranged on the opposite sides of the helical inductance element L, and the capacitor electrodes 14a are connected through the via-hole conductors 13a to the connection electrodes 12 whereby the capacitance elements C1 and C2 are formed. Then, the connection electrodes 12 serving as electrodes on a wireless communication circuit board side is electrically connected through the soldering bumps 6 to electrodes (not shown) on a power supply circuit board side arranged on the wireless communication circuit board 5.

That is, among the elements included in the power supply circuit, the inductance element L which is a coil electrode is used to supply a transmission signal to the radiation plate 20 through magnetic field coupling, and a reception signal is supplied from the radiation plate 20 to the inductance element L via the magnetic field coupling. Therefore, the power supply circuit board 10 is preferably configured such that, among the inductance elements and the capacitance elements, an inductance element is arranged near the radiation plate 20.

In the first example, the radiation plate 20 is a long nonmagnetic body made of an aluminum foil, a copper foil, i.e., a metallic body with both ends open, and is arranged on a product including a flexible insulation resin film 21, such as PET, serving as a base body. The back surface of the power supply circuit board 10 is attached by bonding to the radiation plate 20 using an insulating bonding layer such as an adhesive agent 18.

In terms of sizes, for example, the wireless communication circuit board 5 preferably has a thickness of about 50 to about 100 μm, the soldering bumps 6 have a thickness of about 20 μm, the power supply circuit board 10 has a thickness of about 200 μm to about 500 μm, the adhesive agent 18 has a thickness of about 0.1 μm to about 10 μm, the radiation plate 20 has a thickness of about 1 μm to about 50 μm, and the resin film 21 has a thickness of about 10 μm to about 100 μm. Furthermore, the wireless communication circuit board 5 preferably has a size (area) selected from various sizes such as a size of about 0.4 mm×about 0.4 mm and a size of about 0.9 mm×about 0.8 mm, for example. The power supply circuit board 10 is configured so as to preferably have a size (area) in a range from the same as that of the wireless communication circuit board 5 to a size of approximately about 3 mm×about 3 mm, for example.

Figure 10A:
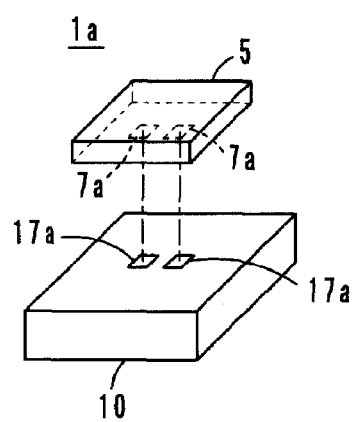
FIGS. 10A and 10B are perspective views illustrating states of a connection between the wireless communication circuit board and the power supply circuit board.
Figure 10B:
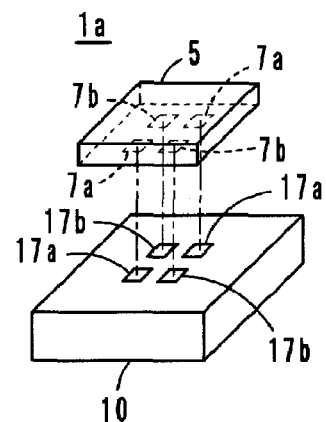

FIGS. 10A and 10B show states of a connection between the wireless communication circuit board 5 and the power supply circuit board 10. In FIG. 10A, a pair of antenna terminals 7a and a pair of antenna terminals 17a are arranged on a back surface of the wireless communication circuit board 5 and the surface of the power supply circuit board 10, respectively. In FIG. 10B, which is another connection state, in addition to the pair of antenna terminals 7a and the pair of antenna terminals 17a, ground terminals 7b and ground terminals 17b are arranged on the back surface of the wireless communication circuit board 5 and the surface of the power supply circuit board 10, respectively. Note that the ground terminals 17b arranged on the power supply circuit board 10 are terminal ends, and therefore, are not connected to other elements of the power supply circuit board 10.

FIG. 8 shows an equivalent circuit of the electromagnetic coupling module 1a. The electromagnetic coupling module 1a receives using the radiation plate 20 a high-frequency signal (for example, in a UHF frequency band) emitted from a transmitter (not shown), resonates the power supply circuit 16 (the LC series resonant circuit including the inductance element L and the capacitance elements C1 and C2) which is connected to the radiation plate 20 through magnetic field coupling, and allows only reception signals in a predetermined frequency band to be supplied to the wireless communication circuit 4. The power supply circuit 16 rectifies an information signal supplied from the wireless communication circuit 4 so that the signal has a predetermined frequency, and then, supplies a transmission signal from the inductance element L of the power supply circuit 16 to the radiation plate 20 through magnetic field coupling. The signal is output from the radiation plate 20.

Note that although the power supply circuit 16 and the radiation plate 20 are connected to each other mainly through magnetic field coupling, electric field coupling may be used. In the present invention, the term "electromagnetic field coupling" means connection via an electric field and/or magnetic field.

In the electromagnetic coupling module 1a of the first example of a preferred embodiment, the wireless communication circuit board 5 is electrically connected to the power supply circuit board 10 which incorporates the power supply circuit 16. The power supply circuit board 10 has an area substantially the same as that of the wireless communication circuit board 5 and is rigid. Accordingly, when compared with a case where the wireless communication circuit board 5 is mounted on a flexible film having a large area in the related art, the wireless communication circuit board 5 is accurately positioned and mounted on the power supply circuit board 10. Furthermore, since the power supply circuit board 10 is formed of a ceramic member and has heat resistance, the wireless communication circuit board 5 is mounted on the power supply circuit board 10 by soldering. That is, unlike the related art, since an ultrasonic bonding method is not used, the cost is reduced, a deterioration of the wireless communication circuit board 5 due to pressure applied at a time of ultrasonic bonding is avoided, and a self-alignment operation by the reflow soldering may be utilized.

Furthermore, in the power supply circuit 16, a resonant frequency characteristic is determined by the resonant circuit including the inductance element L and the capacitance elements C1 and C2. A resonant frequency of a signal emitted from the radiation plate 20 substantially corresponds to a self-resonant frequency of the power supply circuit 16, and a maximum gain of the signal is substantially determined by at least one of a size of the power supply circuit 16, a shape of the power supply circuit 16, a distance between the power supply circuit 16 and the radiation plate 20, and a medium between the power supply circuit 16 and the radiation plate 20. Specifically, in the first example, a length of the radiation plate 20 in a longitudinal direction is half a wavelength $\lambda$ which corresponds to the resonant frequency. However, the length of the radiation plate 20 in the longitudinal direction is not necessarily required to be an integral multiple of $\lambda/2$. That is, in this preferred embodiment, since the frequency of the signal emitted from the radiation plate 20 is substantially determined by the resonant frequency of the resonant circuit (power supply circuit 16), a frequency characteristic does not substantially depend on the length of the radiation plate 20 in the longitudinal direction. If the length of the radiation plate 20 in the longitudinal direction is an integral multiple of $\lambda/2$, the gain becomes maximum, which is preferable.

As described above, because the resonant frequency characteristic of the power supply circuit 16 is determined by the resonant circuit including the inductance element L and the capacitance elements C1 and C2 which is incorporated in the power supply circuit board 10, even when the electromagnetic coupling module 1a is inserted into a book, for example, the resonant frequency characteristic does not change. Furthermore, even when the electromagnetic coupling module 1a is rolled so that a shape of the radiation plate 20 is changed or even when the size of the radiation plate 20 is changed, the resonant frequency characteristic does not change. Moreover, since the coil electrode constituting the inductance element L has a winding axis substantially parallel to the radiation plate 20, differences between stray capacitances generated between the coil electrode and the radiation plate 20 are small in portions of the coil, and therefore, a center frequency is not changed. Furthermore, since the capacitance elements C1 and C2 are inserted into a subsequent stage of the wireless communication circuit board 5, surge in low frequencies is reduced by the capacitance elements C1 and C2 and the wireless communication circuit board 5 is protected from the surge.

Furthermore, since the power supply circuit board 10 is a rigid multilayer board, the wireless communication circuit board 5 is readily mounted on the power supply circuit board 10 by soldering. Moreover, since the radiation plate 20 is formed of a flexible metallic film, the radiation plate 20 is readily arranged on a wrapping film or arranged on a surface of a cylindrical body.

Note that, in this preferred embodiment, the resonant circuit may serve as a matching circuit which matches an impedance of the wireless communication circuit and the impedance of the radiation plate. Alternatively, the power supply circuit board may further include a matching circuit including an inductance element and a capacitance element which is provided separately from the resonant circuit. When a function of the matching circuit is added to the resonant circuit, design of the resonant circuit is likely to be complicated. However, when the matching circuit is provided separately from the resonant circuit, each of the resonant circuit and the matching circuit is independently designed.

Figure 11:
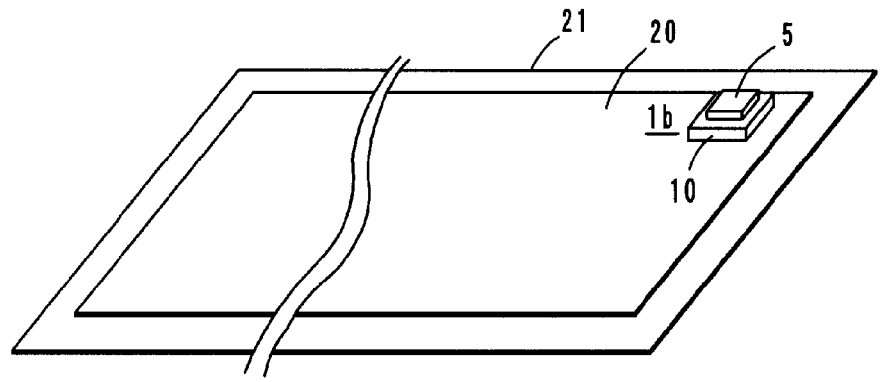
FIG. 11 is a perspective view illustrating a second example of a preferred embodiment of the electromagnetic coupling module.

Second Example of Electromagnetic Coupling Module (Refer to FIG. 11)

An electromagnetic coupling module 1b of a second example of a preferred embodiment is mounted on a radiation plate 20 which is formed of an aluminum foil, for example, having a large area, and the radiation plate 20 is arranged on an insulated plastic film 21 having a large area and flexibility as shown in FIG. 11. A power supply circuit board 10 having a wireless communication circuit board 5 mounted thereon is bonded to an arbitrary portion of the radiation plate 20.

Note that a configuration of the electromagnetic coupling module 1b, that is, an inner configuration of the power supply circuit board 10 is the same as that of the first example. There is an advantage in that high accuracy is not required for a bonding position of the power supply circuit board 10.

Figure 12:
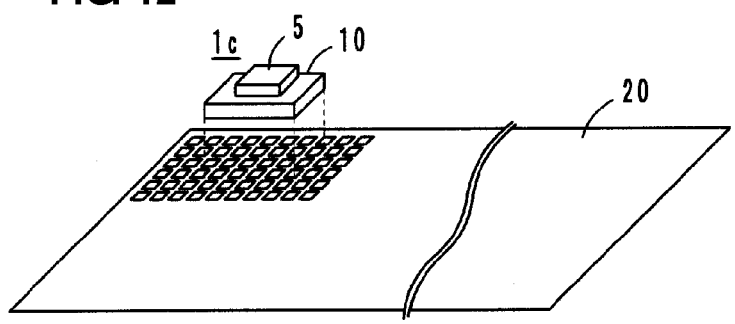
FIG. 12 is a perspective view illustrating a third example of a preferred embodiment of the electromagnetic coupling module.

Third Example of Electromagnetic Coupling Module (Refer to FIG. 12)

An electromagnetic coupling module 1c is mounted on a mesh portion of a radiation plate 20 which is formed of an aluminum foil, for example, having a large area as shown in FIG. 12. The mesh may be formed on an entire surface of the radiation plate 20 or may be formed on a portion of the surface of the radiation plate 20.

A configuration of the electromagnetic coupling module 1c preferably is the same as that of the second example of a preferred embodiment. In addition to the advantage in which high accuracy is not required for a bonding position of a power supply circuit board 10, a magnetic flux of a coil electrode is transmitted through opening portions of the mesh, and therefore, change (reduction) of the magnetic flux generated from the power supply circuit board 10 is suppressed, and a large amount of magnetic flux is transmitted through the radiation plate 20. Accordingly, transmission efficiency of signal energy is improved, and shifts of frequencies generated due to the bonding are reduced.

Figure 13:
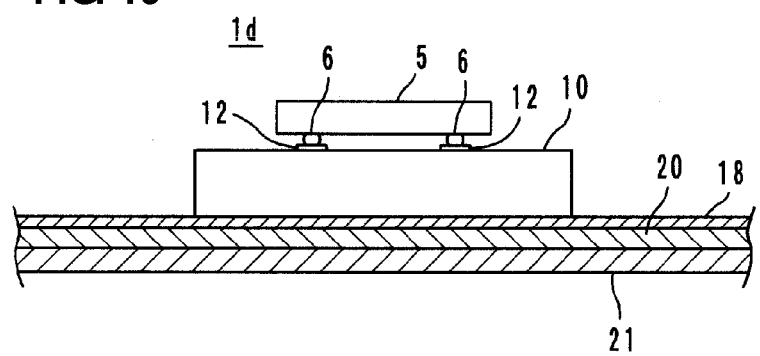
FIG. 13 is a sectional view illustrating a fourth example of a preferred embodiment of the electromagnetic coupling module.

Fourth Example of Electromagnetic Coupling Module (Refer to FIG. 13)

According to an electromagnetic coupling module 1d of a forth example of a preferred embodiment, as shown in FIG. 13, an adhesive agent 18 is applied through a radiation plate 20 to a portion of a surface of a film 21 which contacts to a power supply circuit board 10 and other portions of the surface (an entire surface in this example). A first product including the electromagnetic coupling module 1d may be bonded to a second product so that the electromagnetic coupling module 1d is incorporated.

Note that a configuration of the electromagnetic coupling module 1d, that is, an inner configuration of the power supply circuit board 10 is preferably the same as that of the first example. Accordingly, effects of the fourth example are basically the same as those of the first example.

Figure 14:
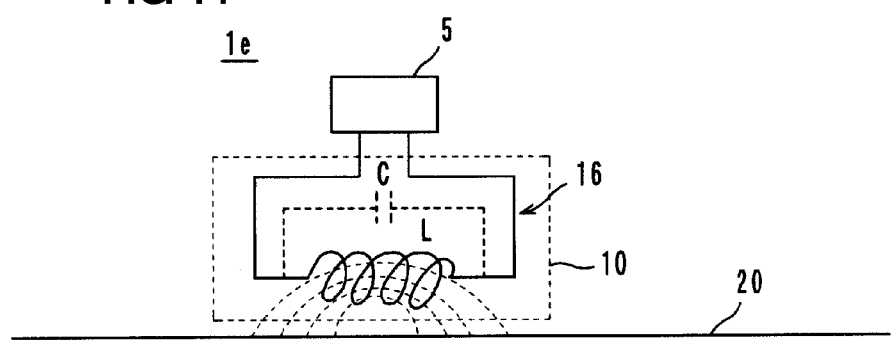
FIG. 14 is an equivalent circuit diagram illustrating a fifth example of a preferred embodiment of the electromagnetic coupling module.

Fifth Example of Electromagnetic Coupling Module (Refer to FIG. 14)

An electromagnetic coupling module 1e is configured such that, as shown in an equivalent circuit of FIG. 14, an inductance element L which is constituted by a coil electrode serving as a power supply circuit 16 is incorporated in a power supply circuit board 10. A capacitance element C is formed as a stray capacitance (distributed constant capacitance) generated between opposite ends of the coil electrode of the inductance element L.

That is, even when a single coil electrode is provided, if the coil electrode has a self resonance, an L component of the coil electrode itself and a C component corresponding to the stray capacitance between the opposite ends of the electrode are serving as an LC parallel resonant circuit, that is, constitute the power supply circuit 16. Accordingly, the electromagnetic coupling module 1e receives using a radiation plate 20 a high-frequency signal (for example, in a UHF frequency band) emitted from a transmitter (not shown), resonates the power supply circuit 16 (the LC parallel resonant circuit including the inductance element L and the capacitance element C) which is connected to the radiation plate 20 mainly through magnetic field coupling, and allows only reception signals in a predetermined frequency band to be supplied to a wireless communication circuit 4. The power supply circuit 16 rectifies an information signal supplied from the wireless communication circuit 4 so that the signal has a predetermined frequency, and then, supplies a transmission signal from the inductance element L of the power supply circuit 16 to the radiation plate 20 through magnetic field coupling. The signal is output from the radiation plate 20.

Figure 15:
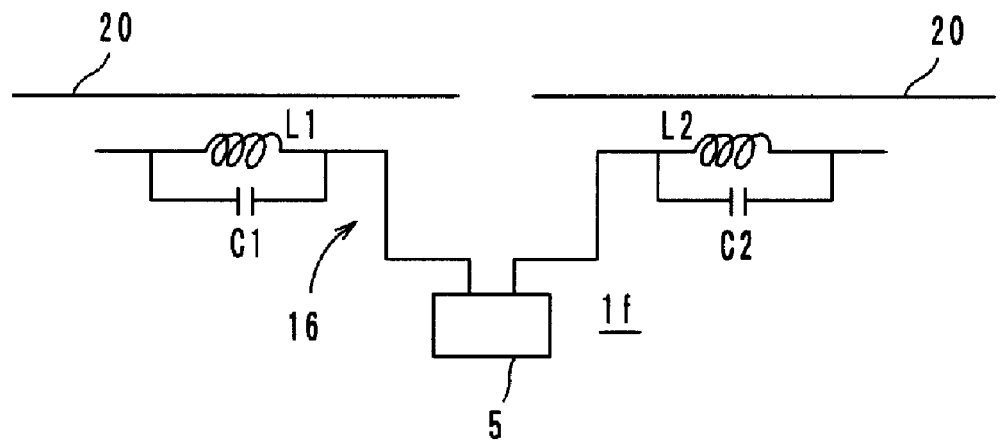
FIG. 15 is an equivalent circuit diagram illustrating a sixth example of a preferred embodiment of the electromagnetic coupling module.

Sixth Example of Electromagnetic Coupling Module (Refer to FIG. 15)

An electromagnetic coupling module 1f of a sixth example of a preferred embodiment includes a power supply circuit 16 for radiation plates 20 constituting a dipole radiation plate as shown in an equivalent circuit of FIG. 15, and the power supply circuit 16 incorporates two LC parallel resonant circuits on a power supply circuit board. An inductance element L1 and a capacitance element C1 are connected to a first port of a wireless communication circuit board 5 so as to oppose one of the radiation plates 20 whereas an inductance element L2 and a capacitance element C2 are connected to a second port of the wireless communication circuit board 5 so as to oppose the other of the radiation plates 20. Each of the inductance element L1 and the capacitance element C1 has open ends. Note that the first port and the second port constitute an I/O of a differential circuit.

Effects of the sixth example are basically the same as those of the first example. Specifically, the electromagnetic coupling module 1f receives using the radiation plates 20 high-frequency signals (for example, in a UHF frequency band) emitted from a transmitter (not shown), resonates the power supply circuit 16 (the LC parallel resonant circuit including the inductance element L1 and the capacitance element C1 and the LC parallel resonant circuit including the inductance element L2 and the capacitance element C2) which is connected to the radiation plates 20 mainly through magnetic field coupling, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals from the inductance element L1 and the inductance element L2 of the power supply circuit 16 to the radiation plates 20 through magnetic field coupling. The signals are output from the radiation plates 20.

Figure 16:
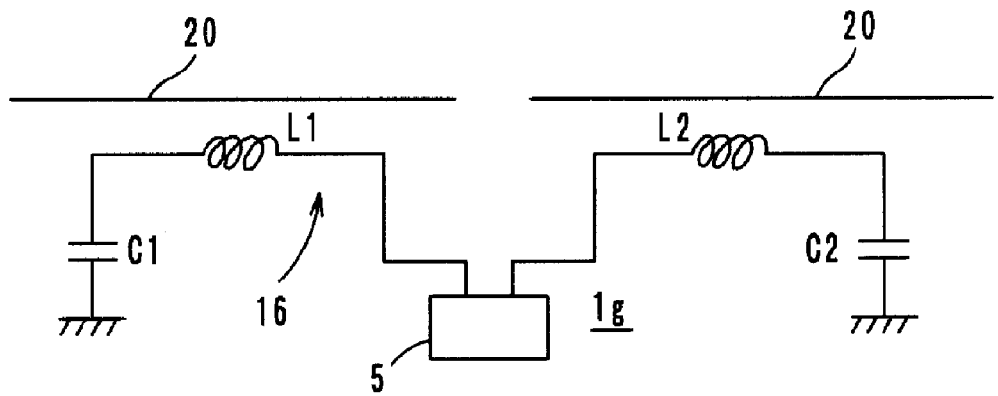
FIG. 16 is an equivalent circuit diagram illustrating a seventh example of a preferred embodiment of the electromagnetic coupling module.

Seventh Example of Electromagnetic Coupling Module (Refer to FIG. 16)

An electromagnetic coupling module 1g of a seventh example of a preferred embodiment includes a power supply circuit 16 for radiation plates 20 constituting a dipole radiation plate as shown in an equivalent circuit in FIG. 16, and the power supply circuit 16 incorporates two LC series resonant circuits on a power supply circuit board. Inductance elements L1 and L2 oppose the radiation plates 20, and capacitance elements C1 and C2 are connected to the ground.

Effects of the seventh example are basically the same as those of the first example. Specifically, the electromagnetic coupling module 1g receives using the radiation plates 20 high-frequency signals (for example, in a UHF frequency band) emitted from a transmitter (not shown), resonates the power supply circuit 16 (the LC series resonant circuit including the inductance element L1 and the capacitance element C1 and the LC series resonant circuit including the inductance element L2 and the capacitance element C2) which is connected to the radiation plates 20 mainly through magnetic field coupling, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals from the inductance element L1 and the inductance element L2 of the power supply circuit 16 to the radiation plates 20 through magnetic field coupling. The signals are output from the radiation plates 20.

Figure 17:
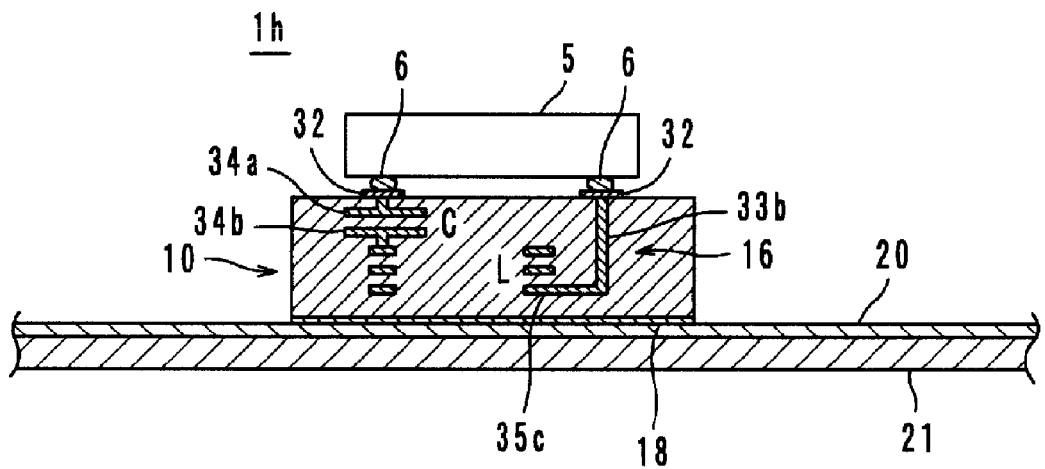
FIG. 17 is a sectional view illustrating an eighth example of a preferred embodiment of the electromagnetic coupling module.
Figure 18:
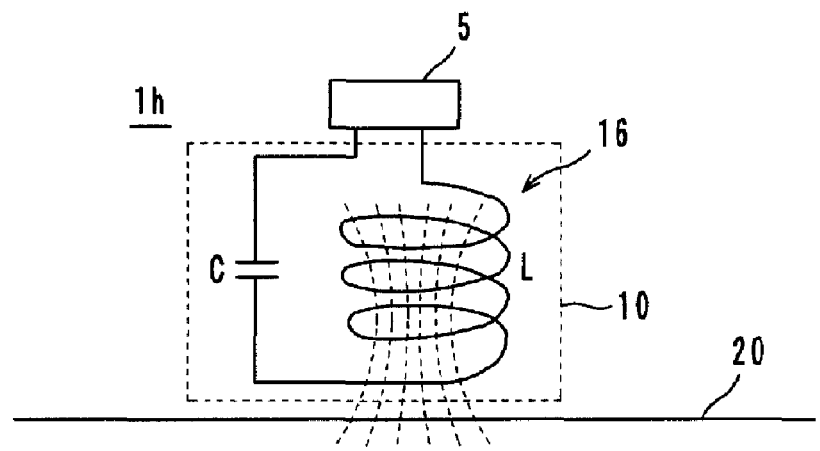
FIG. 18 is a diagram illustrating an equivalent circuit of the eighth example of a preferred embodiment of the present invention.
Figure 19:
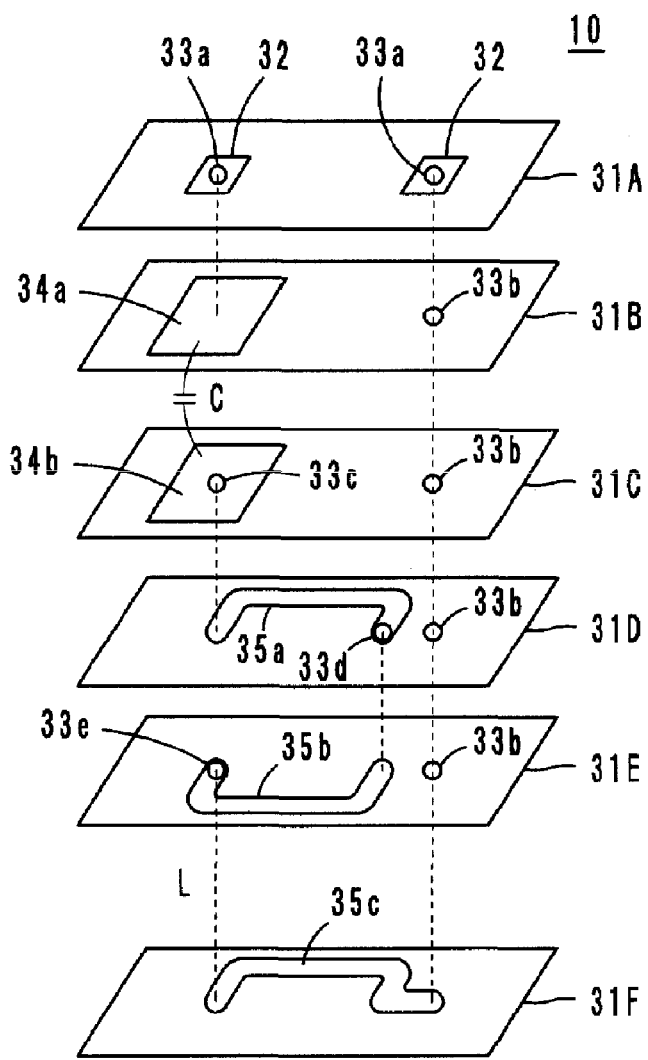
FIG. 19 is an exploded perspective view illustrating a power supply circuit board of the eighth example of a preferred embodiment of the present invention.

Eighth Example of Electromagnetic Coupling Module (Refer to FIGS. 17 to 19)

An electromagnetic coupling module 1h of an eighth example of a preferred embodiment operates in combination with a monopole radiation plate 20 as shown in FIG. 17, and an inductance element L and a capacitance element C which are incorporated in a power supply circuit board 10 and which serve as an LC series resonant circuit constitute a power supply circuit 16. As shown in FIG. 18, a coil electrode constituting the inductance element L has a winding axis substantially perpendicular to the radiation plate 20, and a magnetic field is generated substantially parallel to the winding axis and substantially perpendicular to the radiation plate 20. Eddy currents are generated on the radiation plate 20 due to the magnetic field, and the eddy currents generate another magnetic field to be emitted from the radiation plate 20.

As shown in FIG. 19 in detail, the power supply circuit board 10 includes ceramic sheets 31A to 31F which are laminated and pressure bonded with one another, and sintered, for example. The sheet 31A includes connection electrodes 32 and via-hole conductors 33a, the sheet 31B includes a capacitor electrode 34a and a via-hole conductor 33b, the sheet 31C includes a capacitor electrode 34b, a via-hole conductor 33c and the via-hole conductor 33b, the sheet 31D (a single or a plurality of sheets 31D) includes an inductor electrode 35a, a via-hole conductor 33d and the via-hole conductor 33b, the sheet 31E (a single or a plurality of sheets 31E) includes an inductor electrode 35b, a via-hole conductor 33e, and the via-hole conductor 33b, and the sheet 31F includes an inductor electrode 35c.

By laminating the sheets 31A to 31F, the inductance element L having the axis of helical winding substantially perpendicular to the radiation plate 20 and the power supply circuit 16 constituted by the LC series resonant circuit including the inductance element L and the capacitance element C connected to each other in series are obtained. The capacitor electrode 34a is connected to the connection electrode 32 through one of the via-hole conductors 33a, and further connected to a wireless communication circuit board 5 through a soldering bump 6. One end of the inductance element L is connected to the connection electrode 32 through the via-hole conductor 33 and further connected to the wireless communication circuit board 5 through a soldering bump 6.

Effects of the eighth example are basically the same as those of the first example. Specifically, the electromagnetic coupling module 1h receives using the radiation plate 20 a high-frequency signal (for example, in a UHF frequency band) emitted from a transmitter (not shown), resonates the power supply circuit 16 (the LC series resonant circuit including the inductance element L and the capacitance element C) which is connected to the radiation plate 20 mainly through magnetic field coupling, and allows only reception signals in a predetermined frequency band to be supplied to a wireless communication circuit 4. The power supply circuit 16 rectifies an information signal supplied from the wireless communication circuit 4 so that the signal has a predetermined frequency, and then, supplies a transmission signal from the inductance element L of the power supply circuit 16 to the radiation plate 20 through magnetic field coupling. The signal is output from the radiation plate 20.

In particular, in the eighth example of a preferred embodiment, there is an advantage in that, since the coil electrode has the winding axis substantially perpendicular to the radiation plate 20, an amount of magnetic field component to the radiation plate 20 is increased, and accordingly, transmission efficiency of signal energy is improved and large gain is attained.

Figure 20:
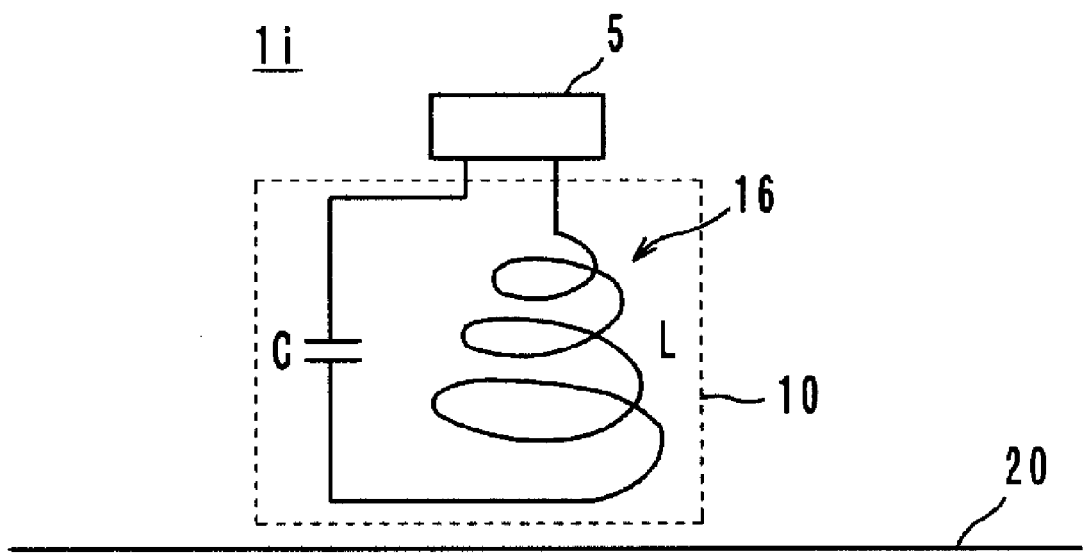
FIG. 20 is an equivalent circuit diagram illustrating a ninth example of a preferred embodiment of the electromagnetic coupling module.

Ninth Example of Electromagnetic Coupling Module (Refer to FIG. 20)

An electromagnetic coupling module 1i of a ninth example of a preferred embodiment is configured, as shown in FIG. 20, such that a winding width (coil diameter) of the coil electrode of the inductance element L described in the eighth example is gradually increased as the coil extends toward a radiation plate 20. Other configurations are the same as those of the eighth example.

The effects of the ninth example are the same as those of the eighth example. In addition, since the winding width (coil diameter) of the coil electrode of the inductance element L is gradually increased toward the radiation plate 20, transmission efficiency of signals is improved.

Figure 21:
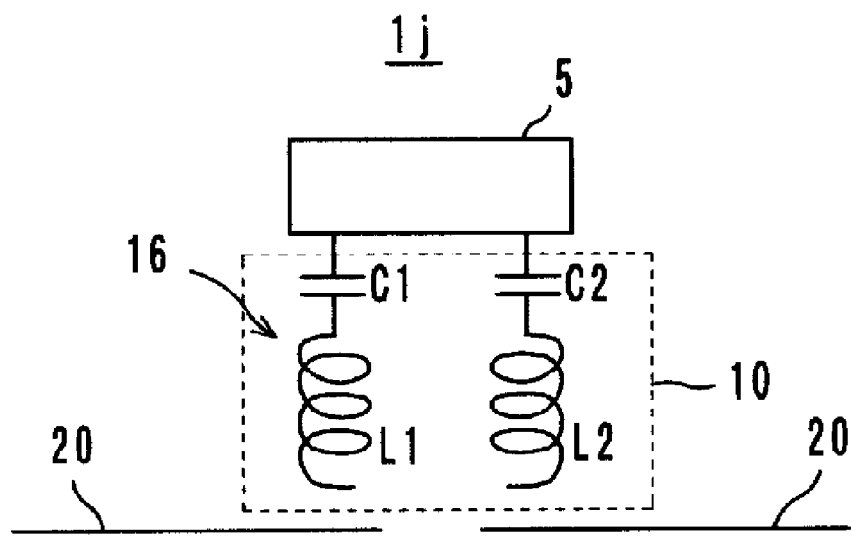
FIG. 21 is an equivalent circuit diagram illustrating a 10th example of a preferred embodiment of the electromagnetic coupling module.
Figure 22:
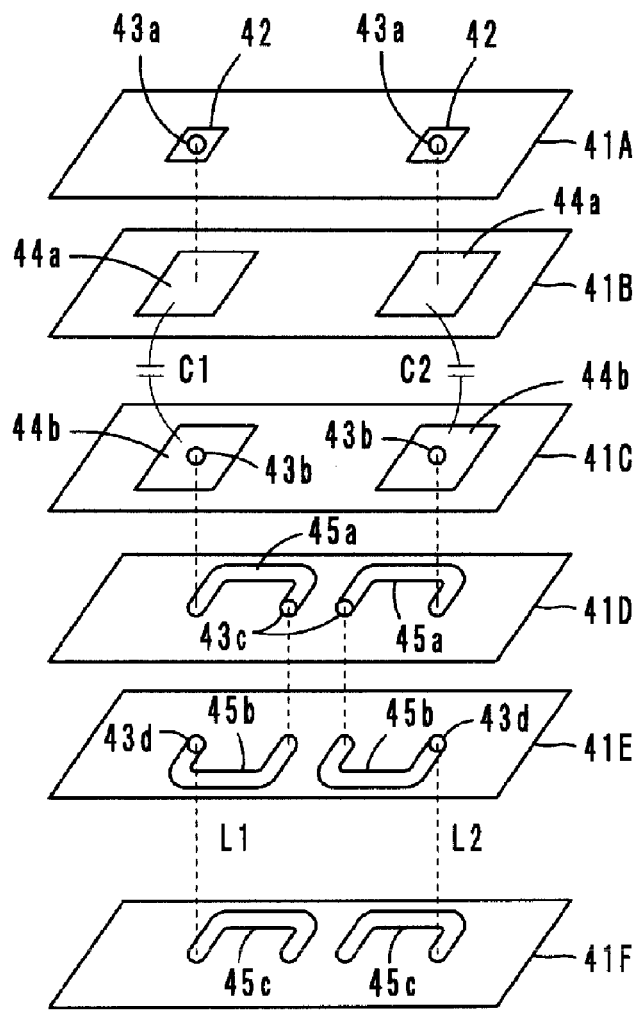
FIG. 22 is an exploded perspective view illustrating a power supply circuit board of the 10th example of a preferred embodiment of the present invention.

Tenth Example of Electromagnetic Coupling Module (Refer to FIGS. 21 and 22)

An electromagnetic coupling module 1j of a 10th example of a preferred embodiment operates with radiation plates 20 constituting a dipole radiation plate as shown in an equivalent circuit of FIG. 21, and has a power supply circuit board 10 incorporating a power supply circuit 16 including two LC series resonant circuits.

As shown in FIG. 22 in detail, the power supply circuit board 10 includes dielectric ceramic sheets 41A to 41F which are laminated and pressure bonded with one another, and sintered, for example. The sheet 41A includes connection electrodes 42 and via-hole conductors 43a, the sheet 41B includes capacitor electrodes 44a, the sheet 41C includes capacitor electrodes 44b and via-hole conductors 43b, the sheet 41D (a single or a plurality of sheets 41D) includes inductor electrodes 45a and via-hole conductors 43c, the sheet 41E (a single or a plurality of sheets 41E) includes inductor electrodes 45b and via-hole conductors 43d, and the sheet 41F includes inductor electrodes 45c.

By laminating the sheets 41A to 41F, inductance elements L1 and L2 each having the axes of helical winding substantially perpendicular to the radiation plate 20 and the power supply circuit 16 constituted by the two LC series resonant circuits including the inductance elements L1 and L2 and capacitance elements C1 and C2 which are connected to each other, respectively, in series are obtained. The capacitor electrode 44a is connected to the connection electrode 42 through the via-hole conductor 43a, and further connected to a wireless communication circuit board 5 through a soldering bump.

Effects of the 10th example are basically the same as those of the first example. Specifically, the electromagnetic coupling module 1j receives using the radiation plates 20 high-frequency signals (for example, in a UHF frequency band) emitted from a transmitter (not shown), resonates the power supply circuit 16 (the LC series resonant circuit including the inductance element L1 and the capacitance element C1 and the LC series resonant circuit including the inductance element L2 and the capacitance element C2) which is connected to the radiation plates 20 mainly through magnetic field coupling, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals from the inductance element L1 and the inductance element L2 of the power supply circuit 16 to the radiation plates 20 through magnetic field coupling. The signals are output from the radiation plates 20.

Furthermore, since the capacitance elements C1 and C2 are inserted into a subsequent stage of the wireless communication circuit board 5 and are arranged between the wireless communication circuit board 5 and the inductance elements L1 and L2, a surge resistance property is improved. Since a surge is low frequency current up to about 200 MHz, the surge is cut using the capacitance elements C1 and C2, and the wireless communication circuit board 5 is prevented from being destroyed by the surge.

Note that, in the 10th example, the resonant circuit including the capacitance element C1 and the inductance element L1 is not connected to the resonant circuit including the capacitance element C2 and the inductance element L2.

Figure 23:
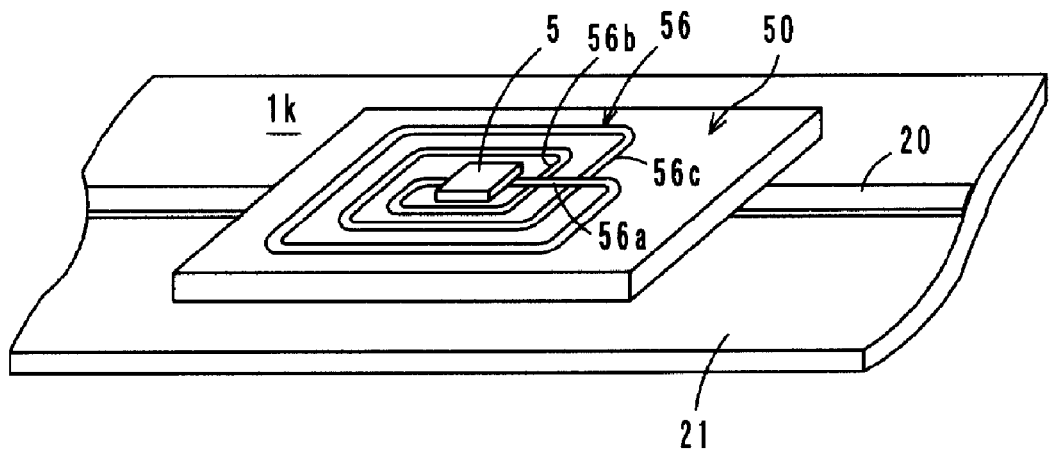
FIG. 23 is a perspective view illustrating an 11th example of a preferred embodiment of the electromagnetic coupling module.

Eleventh Example of Electromagnetic Coupling Module (Refer to FIG. 23)

An electromagnetic coupling module 1k of an 11th example is configured, as shown in FIG. 23, such that a coil electrode is arranged on a surface of a rigid power supply circuit board 50 formed of ceramic or heat resistant resin, that is, a power supply circuit 56 constituted by a spiral inductance element is arranged on the single layer board 50. Both ends of the power supply circuit 56 are directly connected to the wireless communication circuit board 5 through soldering bumps, and the power supply circuit board 50 is bonded to a film 21 which supports a radiation plate 20 using an adhesive agent. Furthermore, an inductor electrode 56a intersects with inductor electrodes 56b and 56c and is separated from the inductor electrodes 56b and 56c using an insulating film, not shown.

The power supply circuit 56 of the 11th example constitutes an LC parallel resonant circuit utilizing a stray capacitance generated in the spiral inductor electrode as a capacitance component. The power supply circuit board 50 is the single layer board formed of a dielectric body or a magnetic body.

In the electromagnetic coupling module 1k of the 11th example, the power supply circuit 56 is connected to the radiation plate 20 mainly through magnetic field coupling. Accordingly, as with the foregoing examples, the electromagnetic coupling module 1k receives using the radiation plate 20 a high-frequency signal emitted from a transmitter, resonates the power supply circuit 56, and allows only reception signals in a predetermined frequency band to be supplied to a wireless communication circuit 4. The power supply circuit 56 rectifies an information signal supplied from the wireless communication circuit 4 so that the signal has a predetermined frequency, and then, supplies a transmission signal from the inductance element of the power supply circuit 56 to the radiation plate 20 through magnetic field coupling. The signal is output from the radiation plate 20.

Since the wireless communication circuit board 5 is mounted on the rigid power supply circuit board 50 having a small area, as with the first example, excellent positioning accuracy is attained, and the wireless communication circuit board 5 can be connected to the power supply circuit board 50 using a soldering bump.

Figure 24:
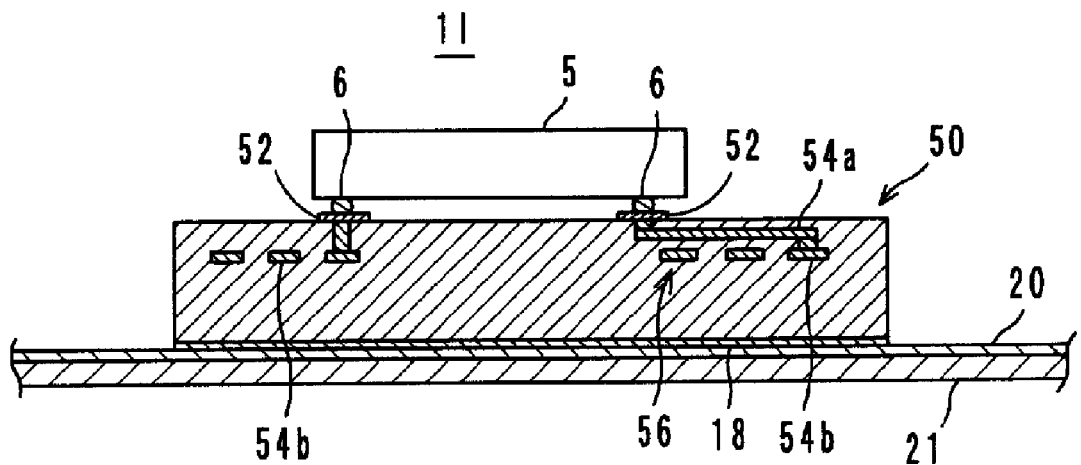
FIG. 24 is a sectional view illustrating a 12th example of a preferred embodiment of the electromagnetic coupling module.
Figure 25:
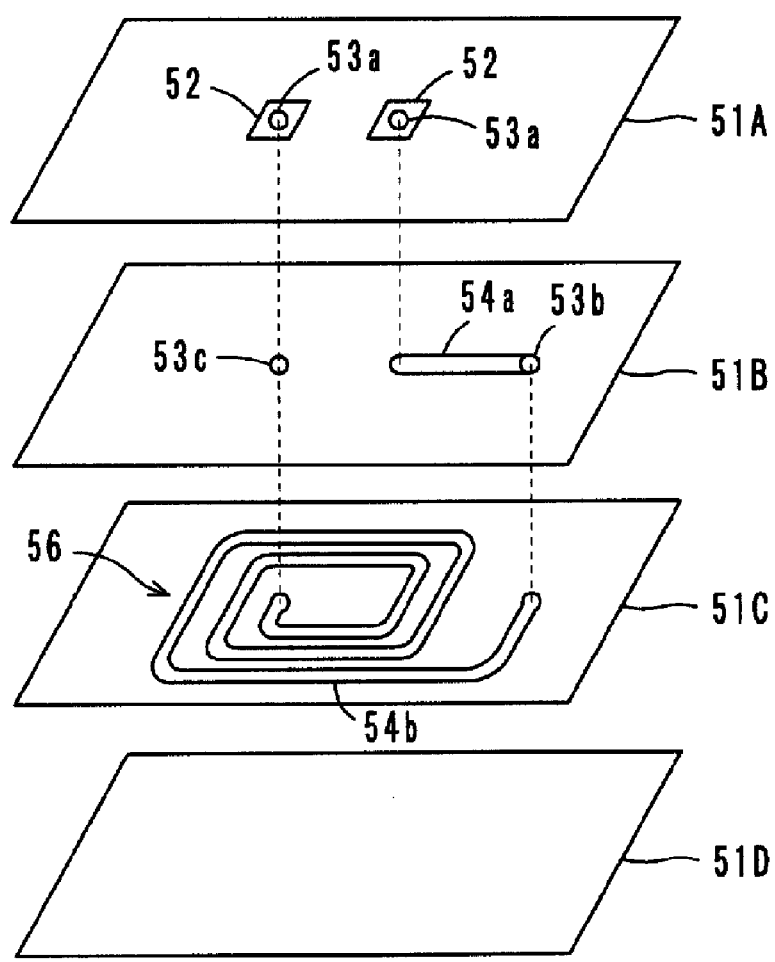
FIG. 25 is an exploded perspective view illustrating a power supply circuit board of the 12th example of a preferred embodiment of the present invention.

Twelfth Example of Electromagnetic Coupling Module (Refer to FIGS. 24 and 25)

An electromagnetic coupling module 1l of a 12th example of a preferred embodiment is configured such that a coil electrode of a power supply circuit 56 is incorporated in a power supply circuit board 50 as shown in FIG. 24. As shown in FIG. 25, the power supply circuit board 50 includes dielectric ceramic sheets 51A to 51D which are laminated and pressure bonded with one another, and sintered, for example. The sheet 51A includes connection electrodes 52 and via-hole conductors 53a, the sheet 51B includes an inductor electrode 54a and via-hole conductors 53b and 53c, the sheet 51C includes an inductor electrode 54b, and the sheet 51D (a plurality of sheets 51) is a plain sheet.

By laminating the sheets 51A to 51D, in the coil electrode, the power supply circuit board 50 which incorporates the power supply circuit 56 including a resonant circuit constituted by a spiral inductance element and a capacitance component generated as a stray capacitance in the spiral electrode is obtained. Connection electrodes 52 arranged on both ends of the power supply circuit 56 are connected to a wireless communication circuit board 5 through soldering bumps 6. Effects of the 12th example are the same as those of the 11th example.

Figure 26:
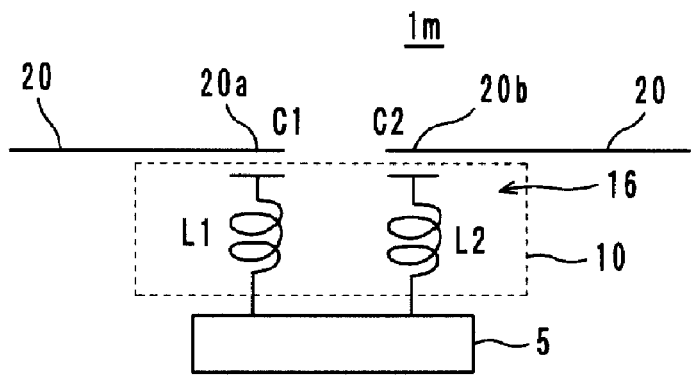
FIG. 26 is a diagram illustrating an equivalent circuit of the 13th example of a preferred embodiment of the present invention.
Figure 27:
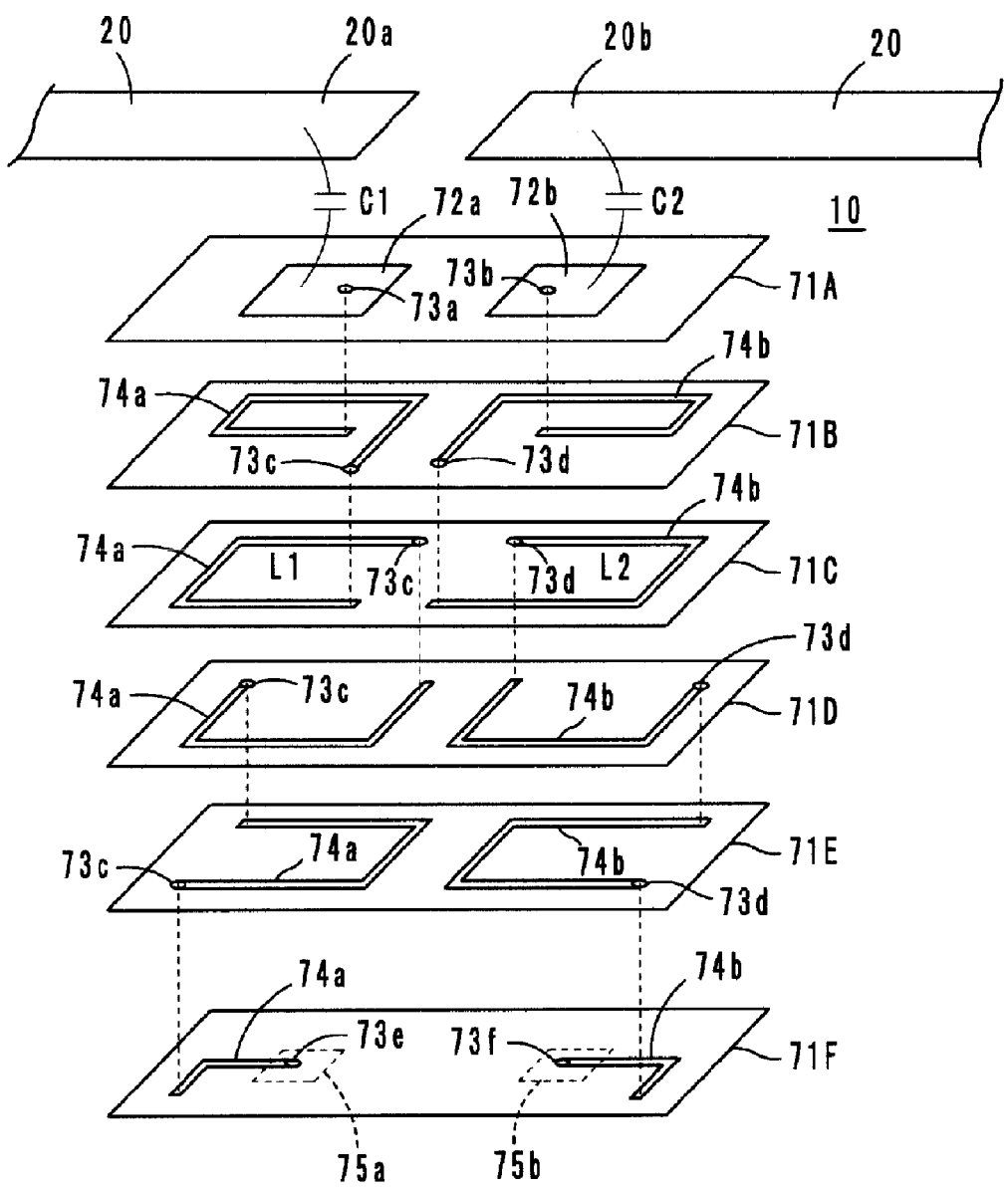
FIG. 27 is an exploded perspective view illustrating a power supply circuit board of the 13th example of a preferred embodiment of the present invention.

Thirteenth Example of Electromagnetic Coupling Module (Refer to FIGS. 26 and 27)

An electromagnetic coupling module 1m of a 13th example of a preferred embodiment is configured, as shown in an equivalent circuit of FIG. 26, such that a power supply circuit board 10 and radiation plates 20 are capacitively coupled with each other. The power supply circuit board 10 includes a power supply circuit 16 having two LC series resonant circuits. One end of an inductance element L1 and one end of an inductance element L2 are connected to a wireless communication circuit board 5, and the other end of the inductance element L1 and the other end of the inductance element L2 are connected to capacitor electrodes 72a and 72b (refer to FIG. 27), respectively, which are included in capacitance elements C1 and C2, respectively, which are arranged on the power supply circuit board 10. Note that one end of one of the radiation plates 20 and one end of the other of the radiation plates 20 serve as capacitor electrodes included in the capacitance elements C1 and C2, respectively.

As shown in FIG. 27 in detail, the power supply circuit board 10 includes dielectric ceramic sheets 71A to 71F which are laminated and pressure bonded with one another, and sintered. The sheet 71A includes capacitor electrodes 72a and 72b and via-hole conductors 73a and 73b, each of the sheet 71B to 71E includes inductor electrodes 74a and 74b and via-hole conductors 73c and 73d, and the sheet 71F includes the inductor electrodes 74a and 74b on one side thereof and includes connection electrodes 75a and 75b on the other side thereof which are connected to the inductor electrodes 74a and 74b through via-hole conductors 73e and 73f.

By laminating the sheets 71A to 71F, the power supply circuit 16 including two LC series resonant circuits, one of which includes the inductance element L1 and the capacitance element C1 connected to each other in series and the other of which includes the inductance element L2 and the capacitance element C2 connected to each other in series is obtained. Since the power supply circuit board 10 is bonded to the radiation plate 20 using an adhesive agent, the capacitor electrodes 72a and 72b which are flat electrodes arranged substantially parallel to the radiation plate 20 oppose the ends 20a and the 20b of the radiation plates 20 through an insulation adhesive layer whereby the capacitance elements C1 and C2 are formed. In addition, since the connection electrodes 75a and 75b are connected to the wireless communication circuit board 5 through soldering bumps, the one end of the inductance element L1 and the one end of the inductance element L2 are connected to the wireless communication circuit board 5, and the wireless communication circuit board 5 and the power supply circuit board 10 are electrically connected to each other.

Note that if the adhesive agent includes dielectric powder, for example, an adhesive layer has a property of a dielectric body, and accordingly, capacities of the capacitance elements C1 and C2 become large. Furthermore, although the capacitor electrodes 72a and 72b which serve as electrodes on a second substrate side are arranged on a back surface of the power supply circuit board 10 in the 13th example, the capacitor electrodes 72a and 72b may be arranged inside the power supply circuit board 10 (in particular, near the radiation plate 20). The capacitor electrode 72a and 72b may be arranged in an inner layer of the power supply circuit board 10.

The effects of the 13th example are basically the same as those of the first example. Specifically, the electromagnetic coupling module 1m receives using the radiation plates 20 high-frequency signals (for example, in a UHF frequency band) emitted from a transmitter (not shown), resonates the power supply circuit 16 (the LC series resonant circuit including the inductance element L1 and the capacitance element C1 and the LC series resonant circuit also including the inductance element L2 and the capacitance element C2) which is connected to the radiation plates 20 mainly in a magnetic field coupling manner, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals to the radiation plates 20 using the capacitance coupling of the capacitance elements C1 and C2. The signals are output from the radiation plates 20.

Figure 28:
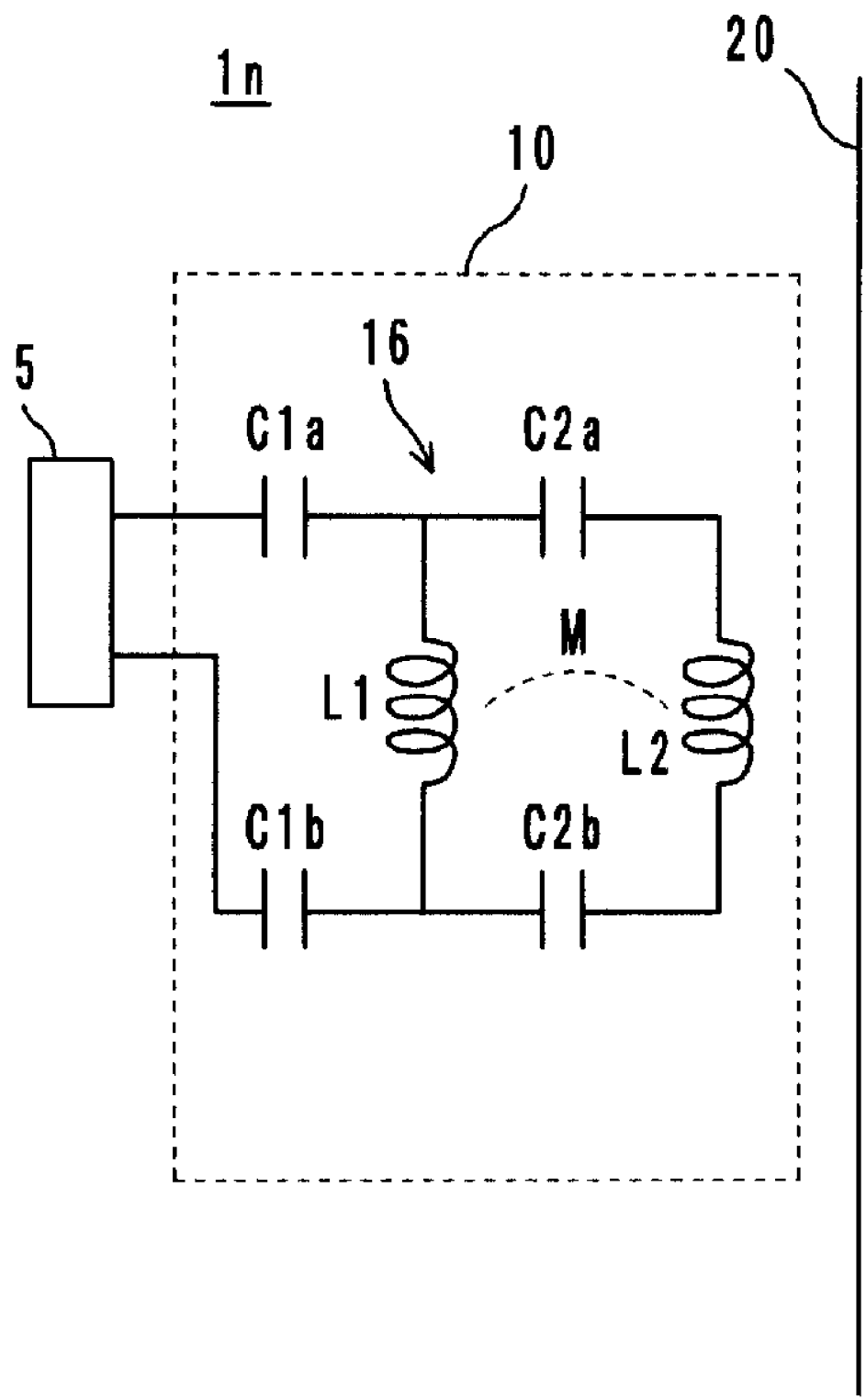
FIG. 28 is a sectional view illustrating a 14th example of a preferred embodiment of the electromagnetic coupling module.
Figure 29:
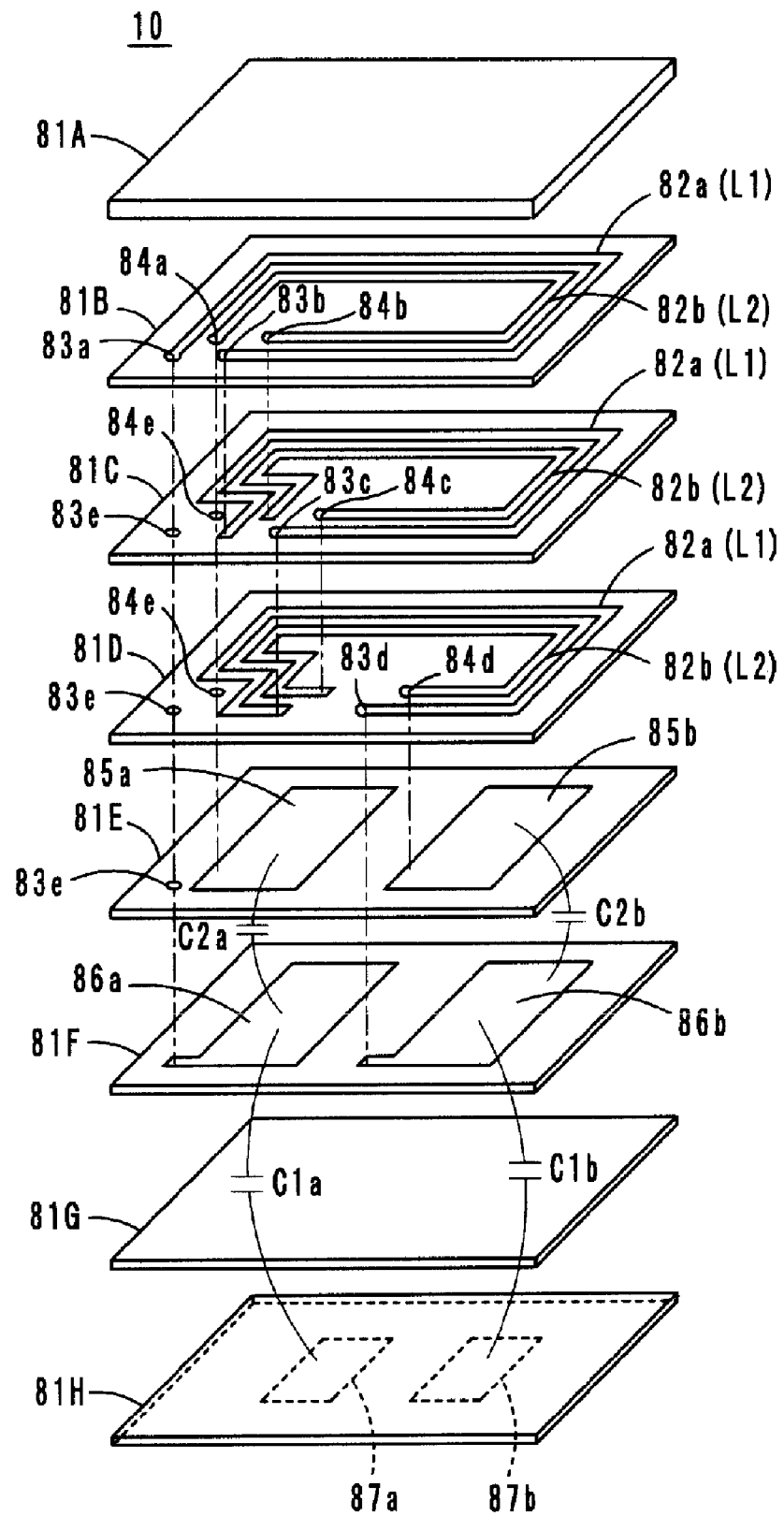
FIG. 29 is an exploded perspective view illustrating a power supply circuit board of the 14th example of a preferred embodiment of the present invention.
Figure 30:
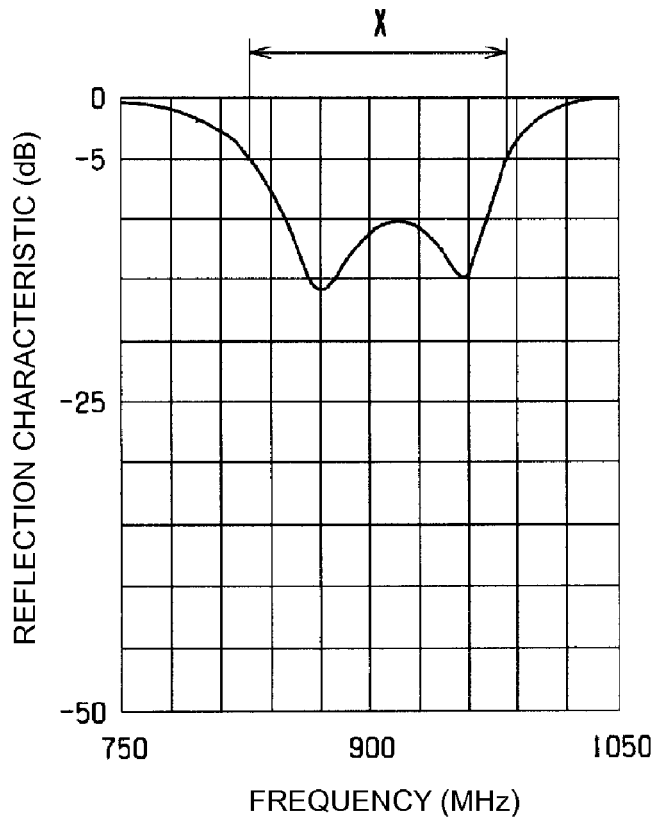
FIG. 30 is a graph illustrating a reflection characteristic of the 14th example of a preferred embodiment of the present invention.

Fourteenth Example of Electromagnetic Coupling Module (Refer to FIGS. 28 to 30)

An electromagnetic coupling module 1n of a 14th example of a preferred embodiment is configured, as shown in an equivalent circuit of FIG. 28, such that a power supply circuit 16 includes inductance elements L1 and L2 which are connected to each other through magnetic field coupling, the inductance element L1 is connected to a wireless communication circuit board 5 through capacitance elements C1a and C1b and connected to the inductance element L2 in parallel through capacitance elements C2a and C2b. In other words, the power supply circuit 16 includes an LC series resonant circuit having the inductance element L1 and the capacitance elements C1a and C1b and an LC series resonant circuit having the inductance element L2 and the capacitance elements C2a and C2b. The resonant circuits are connected to each other through magnetic field coupling represented by a mutual inductance M as shown in FIG. 28. The inductance elements L1 and L2 are connected to a radiation plate 20 through magnetic field coupling.

As shown in FIG. 29 in detail, the power supply circuit board 10 includes dielectric ceramic sheets 81A to 81H which are laminated and pressure bonded with one another, and sintered. The sheet 81A is a plain sheet, the sheet 81B includes inductor electrodes 82a and 82b and via-hole conductors 83a, 83b, 84a, and 84b, the sheet 81C includes the inductor electrodes 82a and 82b and via-hole conductors 83c, 84c, 83e, and 84e, the sheet 81D includes the inductor electrodes 82a and 82b and via-hole conductors 83d, 84d, 83e, and 84e, the sheet 81E includes capacitor electrodes 85a and 85b and a via-hole conductor 83e, the sheet 81F includes the capacitor electrodes 86a and 86b, the sheet 81G is a plain sheet, and the sheet 81H includes capacitor electrodes 87a and 87b on a back surface thereof.

By laminating the sheets 81A to 81H, the inductor electrode 82a is formed as the inductance element L1 through connection using the via-hole conductors 83b and 83c, and the inductor electrode 82b is formed as the inductance element L2 through connection using the via-hole conductors 84b and 84c. The capacitor electrodes 86a and 87a constitute a capacitance element C1a, and the capacitor electrode 86a is connected through the via-hole conductor 83e to one end of the inductance element L1. The capacitor electrodes 86b and 87b constitute a capacitance element C1b, and the capacitor electrode 86b is connected through the via-hole conductor 83d to the other end of the inductance element L1. The capacitor electrodes 85a and 86a constitute a capacitance element C2a, and the capacitor electrode 85a is connected through the via-hole 84e to one end of the inductance element L2. The capacitor electrodes 85b and 86b constitute a capacitance element C2b, and the capacitor electrode 85b is connected through the via-hole conductor 84d to the other end of the inductance element L2.

Effects of the 14th example are basically the same as those of the first example. Specifically, the electromagnetic coupling module 1n receives using the radiation plate 20 a high-frequency signal (for example, in a UHF frequency band) emitted from a transmitter (not shown), resonates the power supply circuit 16 (the LC series resonant circuit including the inductance element L1 and the capacitance elements C1a and C1b and the LC series resonant circuit including the inductance element L2 and the capacitance elements C2a and C2b) which is connected to the radiation plate 20 mainly through magnetic field coupling, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals from the inductance element L1 and L2 of the power supply circuit 16 to the radiation plate 20 through magnetic field coupling. The signals are output from the radiation plate 20.

In particular, in the 14th example, a frequency band is widened as represented by a band width X in FIG. 30 relative to a reflection characteristic. This is because the power supply circuit 16 is constituted by the plurality of LC resonant circuits including the inductance elements L1 and L2 which are connected to each other through magnetic field coupling with a high coupling degree. Furthermore, since the capacitance elements C1a and C1b are inserted into a subsequent stage of the wireless communication circuit board 5, a surge resistance property is improved.

Figure 31:
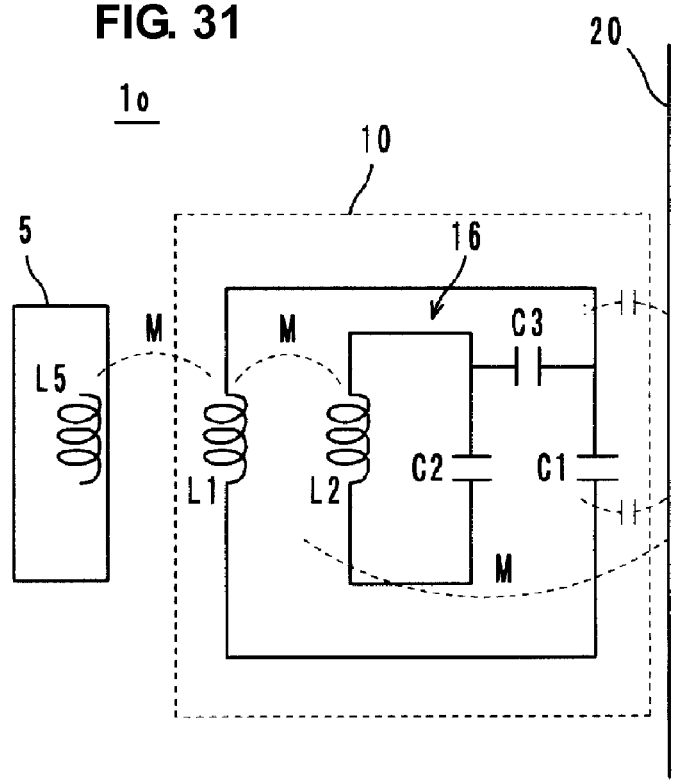
FIG. 31 is a sectional view illustrating a 15th example of a preferred embodiment of the electromagnetic coupling module.
Figure 32:
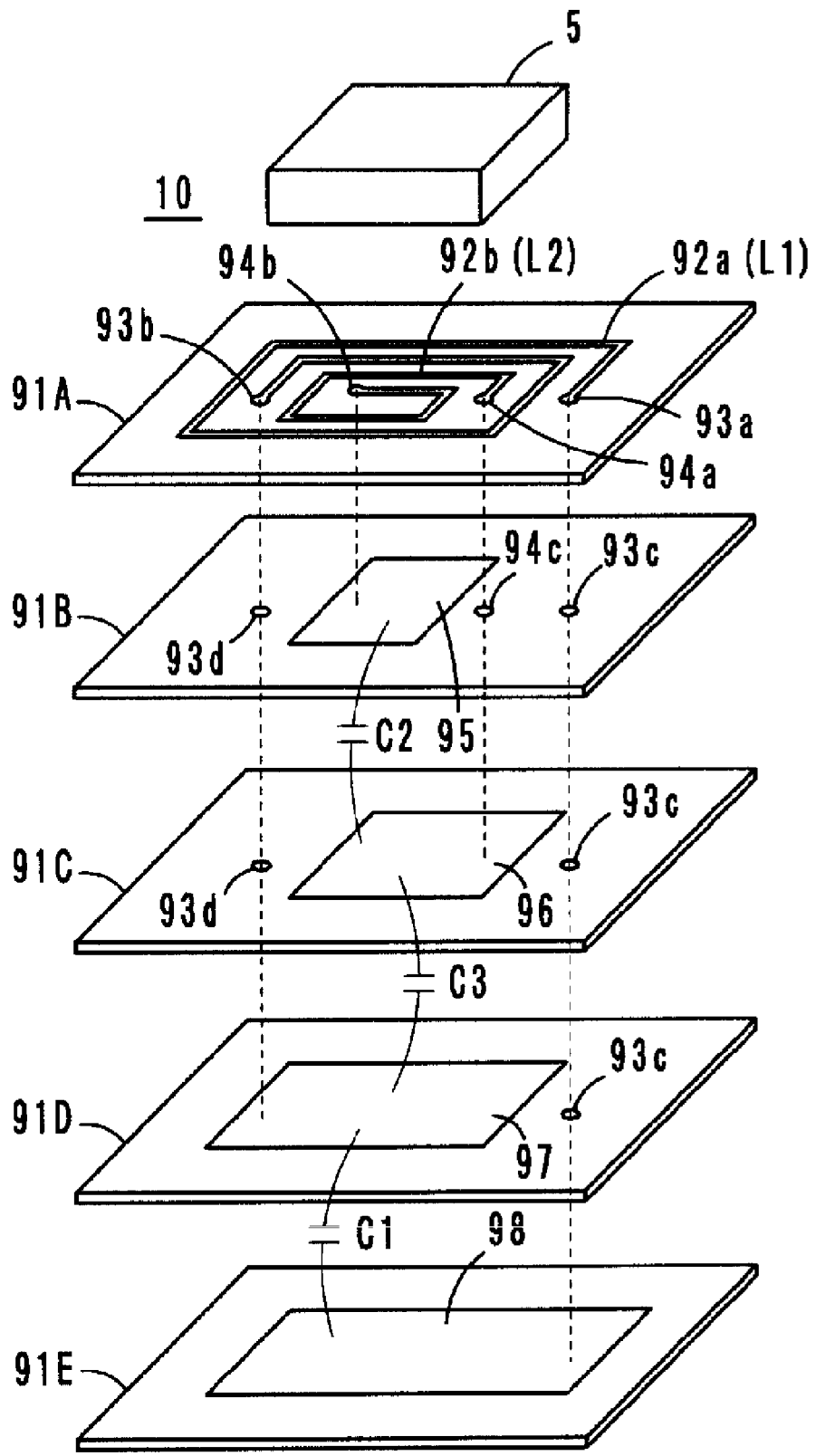
FIG. 32 is an exploded perspective view illustrating a power supply circuit board of the 15th example of a preferred embodiment of the present invention.
Figure 33:
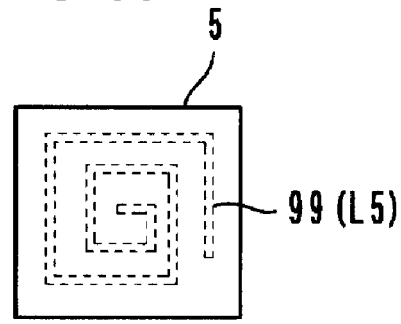
FIG. 33 shows diagrams illustrating wireless communication circuit board of the 15th example of a preferred embodiment of the present invention.
Figure 33:
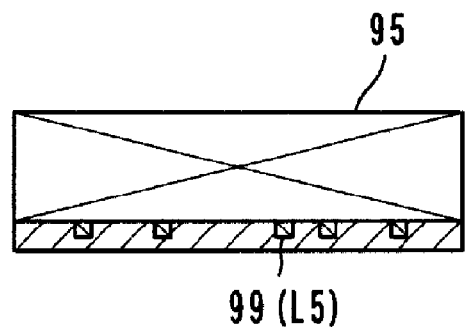

Fifteenth Example of Electromagnetic Coupling Module (Refer to FIGS. 31 to 33)

An electromagnetic coupling module 1o of a 15th example of a preferred embodiment is configured, as shown in an equivalent circuit of FIG. 31, such that a power supply circuit 16 includes inductance elements L1 and L2 which are connected to each other through magnetic field coupling with a high coupling degree. The inductance element L1 is connected to an inductance element L5 arranged on a wireless communication circuit board 5 through magnetic field coupling M, and the inductance element L2 and a capacitance element C2 constitute an LC series resonant circuit. Furthermore, the capacitance element C1 is capacitively coupled with a radiation plate 20, and another capacitance element C3 is inserted between the capacitance elements C1 and C2.

As shown in FIG. 32 in detail, a power supply circuit board 10 includes dielectric ceramic sheets 91A to 91E which are laminated and pressure bonded with one another, and sintered, for example. The sheet 91A includes inductor electrodes 92a and 92b and via-hole conductors 93a, 93b, 94a, and 94b, the sheet 91B includes a capacitor electrode 95 and via-hole conductors 93c, 93d, and 94c, the sheet 91C includes a capacitor electrode 96 and the via-hole conductors 93c and 93d, the sheet 91D includes a capacitor electrode 97 and the via-hole conductor 93c, and the sheet 91E includes a capacitor electrode 98.

By laminating the sheets 91A to 91E, the inductor electrode 92a constitutes the inductance element L1, and the inductor electrode 92b constitutes the inductance element L2. The capacitor electrodes 97 and 98 constitute the capacitance element C1. One end of the inductance element L1 is connected through the via-hole conductors 93a and 93c to the capacitor electrode 98, and the other end thereof is connected through the via-hole conductors 93b and 93d to the capacitor electrode 97. The capacitor electrodes 95 and 96 constitute the capacitance element C2. One end of the inductance element L2 is connected through the via-hole conductors 94a and 94c to the capacitor electrode 96, and the other end thereof is connected through the via-hole conductor 94b to the capacitor electrode 95. In addition, the capacitor electrodes 96 and 97 constitute the capacitance element C3.

Furthermore, as shown in FIG. 33, a coil electrode 99 serving as an electrode on the wireless communication circuit board side is arranged on a back surface of the wireless communication circuit board 5, and serves as the inductance element L5. Note that a protection film 95 made of resin, for example, is arranged on a surface of the coil electrode 99. By this, the inductance elements L1 and L2 each of which is constituted by a coil electrode serving as an electrode on the power supply circuit board side and the coil electrode 99 are connected to each other through magnetic field coupling.

Effects of the 15th example are basically the same as those of the first example. Specifically, the electromagnetic coupling module 1o receives using the radiation plate 20 a high-frequency signal (for example, in a UHF frequency band) emitted from a transmitter (not shown), resonates the power supply circuit 16 (the LC series resonant circuit including the inductance element L2 and the capacitance elements C2) which is connected to the radiation plate 20 mainly through magnetic field coupling, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals to the radiation plate 20 through capacitance coupling and magnetic field coupling. The signals are output from the radiation plate 20. The power supply circuit 16 and the wireless communication circuit board 5 are connected to each other using the inductance elements L1 and L5 through magnetic field coupling so that electric power and transmission/reception signals are supplied.

Figure 34:
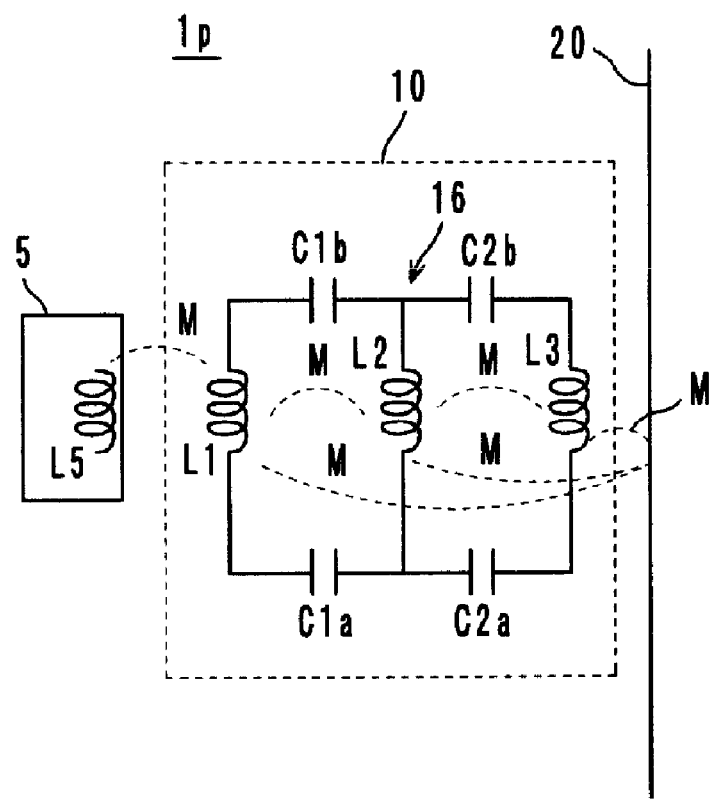
FIG. 34 is a sectional view illustrating a 16th example of a preferred embodiment of the electromagnetic coupling module.
Figure 35:
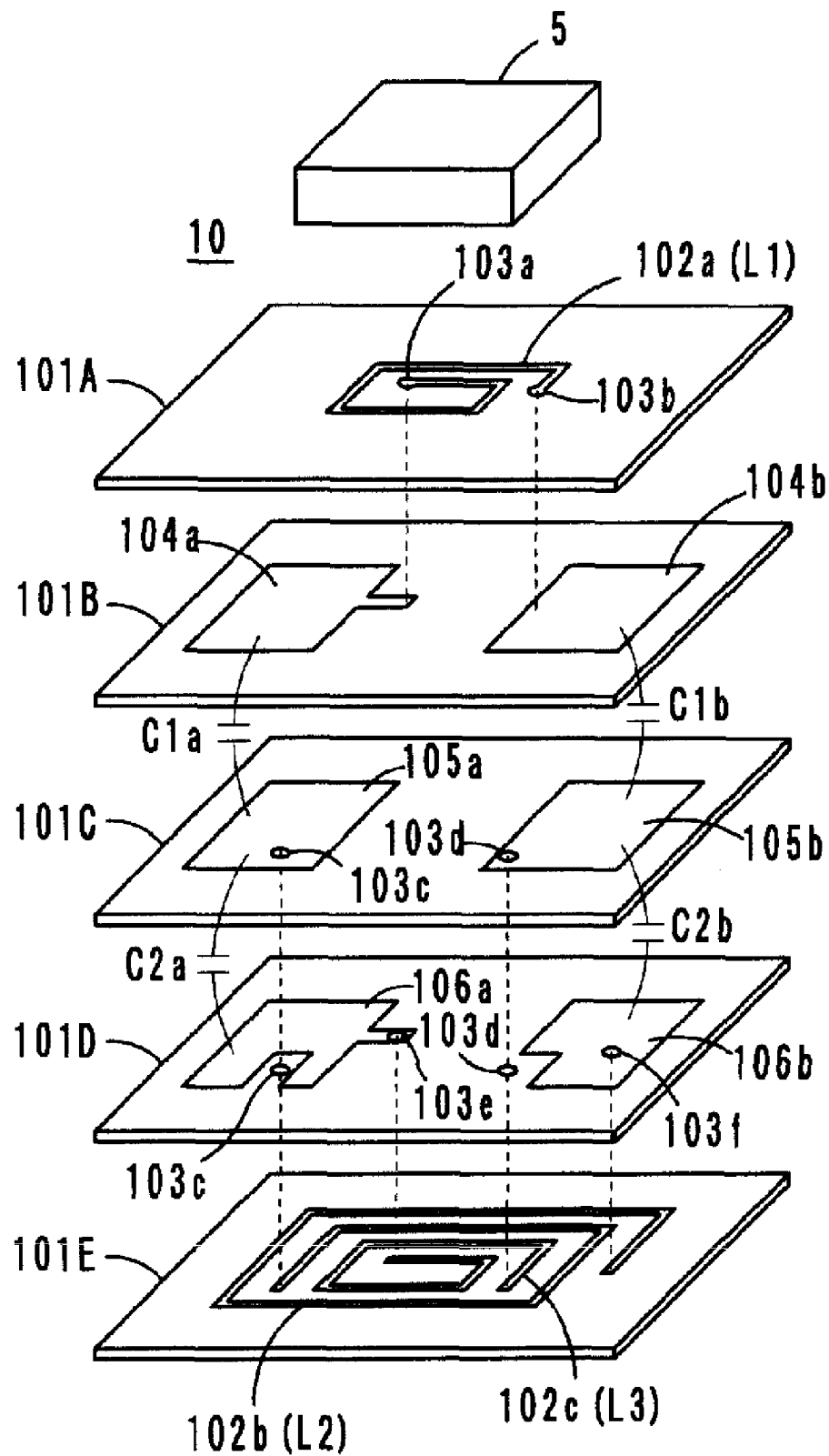
FIG. 35 is an exploded perspective view illustrating a power supply circuit board of the 16th example of a preferred embodiment of the present invention.

Sixteenth Example of Electromagnetic Coupling Module (Refer to FIGS. 34 and 35)

An electromagnetic coupling module 1p is configured, as shown in an equivalent circuit of FIG. 34, such that a power supply circuit 16 includes inductance element L1, L2, and L3, which are connected to one another through magnetic field coupling with a high coupling degree. The inductance element L1 is connected to an inductance element L5 arranged on a wireless communication circuit board 5 through magnetic field coupling, the inductance element L2 and capacitor electrodes C1a and C1b constitute an LC series resonant circuit, and the inductance element L3 and capacitor electrodes C2a and C2b constitute an LC series resonant circuit. Furthermore, the inductance elements L1, L2, and L3 are connected to a radiation plate 20 through magnetic field coupling.

As shown in FIG. 35 in detail, a power supply circuit board 10 includes dielectric ceramic sheets 101A to 101E which are laminated and pressure bonded with one another, and sintered. The sheet 101A includes an inductor electrode 102a and via-hole conductors 103a and 103b, the sheet 101B includes capacitor electrodes 104a and 104b, the sheet 101C includes capacitor electrodes 105a and 105b and via-hole conductors 103c and 103d, the sheet 101D includes capacitor electrodes 106a and 106b, the via-hole conductors 103c and 103d, and via-hole conductors 103e and 103f, and the sheet 101E includes inductor electrodes 102b and 102c. That is, gaps are generated between the electrodes 104a, 105a, and 106a constituting the capacitor electrodes C1a and C2a and the electrodes 104b, 105b, and 106b constituting the capacitor electrodes C1b and C2b so that a magnetic flux generated by the inductance element L1 reaches the inductance elements L2 and L3 and further reaches the radiation plate 20.

By laminating the sheets 101A to 101E, the inductor electrode 102a constitutes the inductance element L1, the inductor electrode 102b constitutes the inductance element L2, and the inductor electrode 102c constitutes the inductance element L3. The capacitor electrodes 104a and 105a constitute the capacitance element C1a, and the capacitor electrodes 104b and 105b constitute the capacitance element C1b. Furthermore, the capacitor electrodes 105a and 106a constitute the capacitance element C2a, and the capacitor electrodes 105b and 106b constitute the capacitance element C2b.

One end of the inductance element L1 is connected through the via-hole conductor 103a to the capacitor electrode 104a, and the other end thereof is connected through the via-hole conductor 103b to the to capacitor electrode 104b. One end of the inductance element L2 is connected through the via-hole conductor 103c to the capacitor electrode 105a, and the other end thereof is connected through the via-hole conductor 103f to the capacitor electrode 106b. One end of the inductance element L3 is connected through the via-hole conductor 103e to the capacitor electrode 106a, and the other end thereof is connected through the via-hole conductor 103d to the capacitor electrode 105b.

Furthermore, as shown in FIG. 33, a coil electrode 99 serving as an electrode on the wireless communication circuit board side is arranged on a back surface of the wireless communication circuit board 5, and serves as the inductance element L5. Note that a protection film 95 made of resin, for example, is arranged on a surface of the coil electrode 99. By this, the inductance elements L1 which are constituted by a coil electrode serving as an electrode on the power supply circuit board side and the coil electrode 99 are connected to each other through magnetic field coupling.

Effects of the 16th example are basically the same as those of the 14th example. Specifically, the electromagnetic coupling module 1p receives using the radiation plate 20 a high-frequency signal (for example, in a UHF frequency band) emitted from a transmitter (not shown), resonates the power supply circuit 16 (the LC series resonant circuit including the inductance element L2 and the capacitance elements C1a and C1b and the LC series resonant circuit including the inductance element L3 and the capacitance elements C2a and C2b) which is connected to the radiation plate 20 mainly through magnetic field coupling, and allows only reception signals in a predetermined frequency band to be supplied to a wireless communication circuit 4. The power supply circuit 16 rectifies information signals supplied from the wireless communication circuit 4 so that the signal has a predetermined frequency, and then, supplies transmission signals from the inductance elements L1, L2, and L3 to the radiation plate 20 through magnetic field coupling. The signals are output from the radiation plate 20. The power supply circuit 16 and the wireless communication circuit board 5 are connected to each other using the inductance elements L1 and L5 through magnetic field coupling so that electric power and transmission/reception signals are transmitted.

In particular, as with the 14th example, a frequency band is widened since the power supply circuit 16 is constituted by the plurality of LC resonant circuits including the inductance elements L2 and L3 which are connected to each other through magnetic field coupling in the 16th example.

Seventeenth Example of Electromagnetic Coupling Module (Refer to FIGS. 36 to 39)

Figure 36:
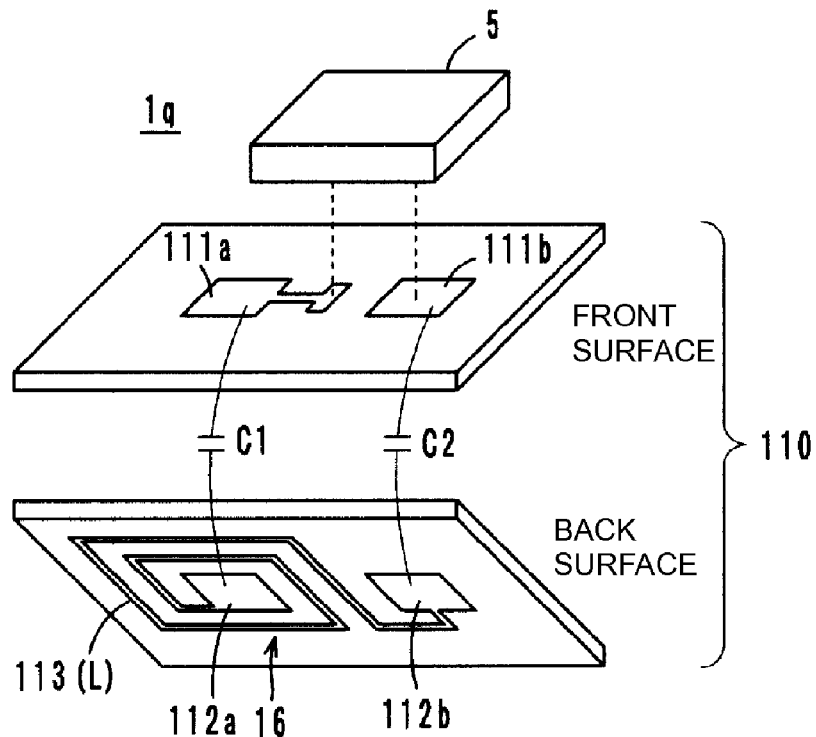
FIG. 36 is an exploded perspective view illustrating a 17th example of a preferred embodiment of the electromagnetic coupling module.

An electromagnetic coupling module 1q of a 17th example includes a power supply circuit board 110 which is a single layer board, and an equivalent circuit thereof is the same as that shown in FIG. 8. Specifically, the power supply circuit 16 is configured such that capacitance elements C1 and C2 are connected to both ends of an inductance element L whereby an LC series resonant circuit is constituted. The power supply circuit board 110 is dielectric ceramic board, and has capacitor electrodes 111a and 111b on a surface thereof and capacitor electrodes 112a and 112b and an inductor electrode 113 on a back surface thereof as shown in FIG. 36. The capacitor electrodes 111a and 112a constitute the capacitance element C1, and the capacitor electrodes 111b and 112b constitute the capacitance element C2.

Effects of the 17th example are basically the same as those of the first example. Specifically, the electromagnetic coupling module 1q receives using the radiation plate 20 a high-frequency signal (for example, in a UHF frequency band) emitted from a transmitter (not shown), resonates the power supply circuit 16 (the LC series resonant circuit including the inductance element L and the capacitance elements C1 and C2) which is connected to the radiation plate 20 mainly through magnetic field coupling, and allows only reception signals in a predetermined frequency band to be supplied to a wireless communication circuit 4. The power supply circuit 16 rectifies an information signal supplied from the wireless communication circuit 4 so that the signal has a predetermined frequency, and then, supplies a transmission signal from the inductance element L of the power supply circuit 16 to the radiation plate 20 through magnetic field coupling. The signals are output from the radiation plate 20.

Figure 37:
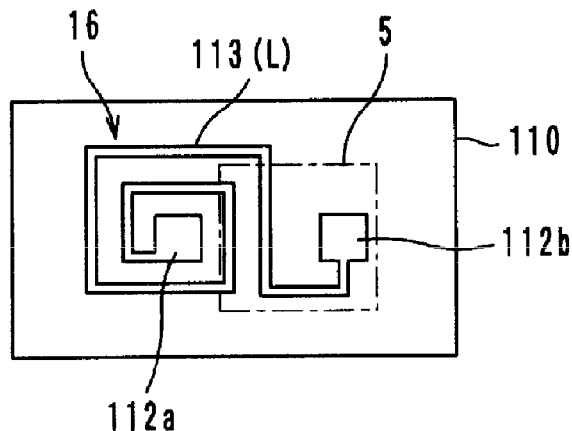
FIG. 37 is a bottom view of a power supply circuit board including a wireless communication circuit board mounted thereon of the 17th example of a preferred embodiment of the present invention.
Figure 38:
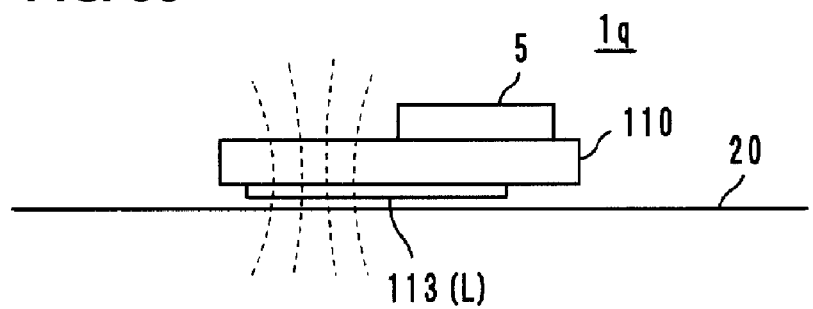
FIG. 38 is a side view illustrating the 17th example of a preferred embodiment of the present invention.

In particular, in the 17th example, the inductance element L is arranged so as to only partially overlap with the wireless communication circuit board 5 in a plan view as shown in FIGS. 37 and 38. Therefore, most magnetic flux generated in the inductance element L is not prevented from transmitted by the wireless communication circuit board 5, and the initial rise of the magnetic flux is improved.

Figure 39:
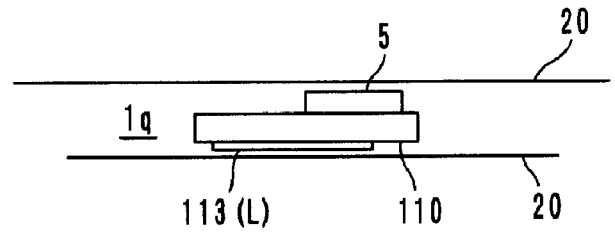
FIG. 39 is a side view illustrating a modification of the 17th example of a preferred embodiment of the present invention.

Note that, in the 17th example, the power supply circuit board 110 on which the wireless communication circuit board 5 is arranged may be sandwiched between radiation plates 20 as shown in FIG. 39. An efficiency of the magnetic field coupling between the power supply circuit 16 and the radiation plates 20 is improved and gain is improved.

Figure 40:
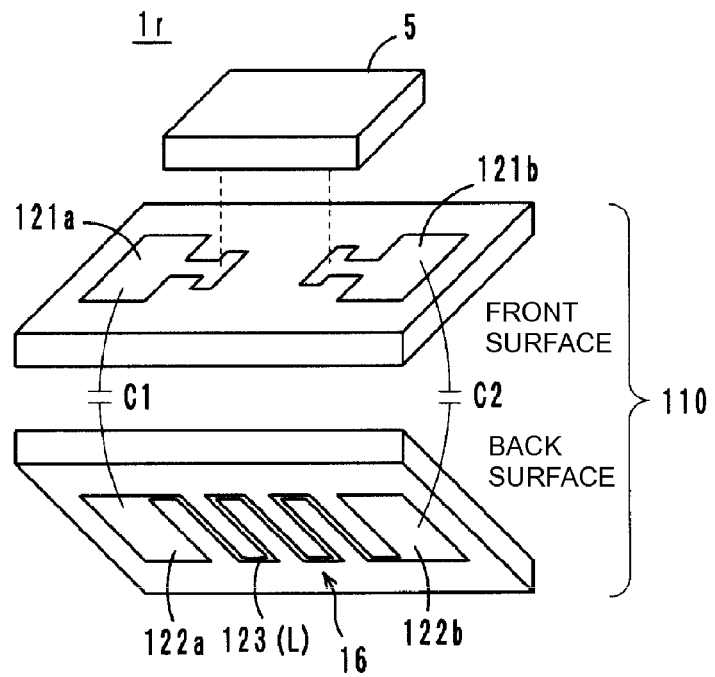
FIG. 40 is an exploded perspective view illustrating an 18th example of a preferred embodiment of the electromagnetic coupling module.

Eighteenth Example of Electromagnetic Coupling Module (Refer to FIG. 40)

An electromagnetic coupling module 1r of an 18th example of a preferred embodiment is configured such that an inductance element L is formed by a meandering line electrode, and an equivalent circuit thereof is the same as that shown in FIG. 8. Specifically, a power supply circuit 16 is configured such that capacitance elements C1 and C2 are connected to both ends of an inductance element L whereby an LC series resonant circuit is constituted. The power supply circuit board 110 is dielectric ceramic single layer board, and has capacitor electrodes 121a and 121b on a surface thereof and capacitor electrodes 122a and 122b and a meandering inductor electrode 123 on a back surface thereof as shown in FIG. 40. The capacitor electrodes 121a and 122a constitute the capacitance element C1 and the capacitor electrodes 121b and 122b constitute the capacitance element C2.

Effects of the 18th example are basically the same as those of the first example. Specifically, the electromagnetic coupling module 1r receives using the radiation plate 20 a high-frequency signal (for example, in a UHF frequency band) emitted from a transmitter (not shown), resonates the power supply circuit 16 (the LC series resonant circuit including the inductance element L and the capacitance elements C1 and C2) which is connected to the radiation plate 20 mainly through magnetic field coupling, and allows only reception signals in a predetermined frequency band to be supplied to a wireless communication circuit 4. The power supply circuit 16 rectifies an information signal supplied from the wireless communication circuit 4 so that the signal has a predetermined frequency, and then, supplies a transmission signal from the inductance element L of the power supply circuit 16 to the radiation plate through magnetic field coupling. The signals are output from the radiation plate.

In particular, in the 18th example, since the inductance element L is constituted by the meandering inductor electrode 123, transmission and reception of a high frequency signal are performed effectively.

Note that in each of the 17th and 18th examples, the power supply circuit board 110 may be constituted by a multilayer board.

Next, preferred embodiments of various products including the above described electromagnetic coupling modules 1 (1a to 1r) will be described.

First Preferred Embodiment

Figure 41:
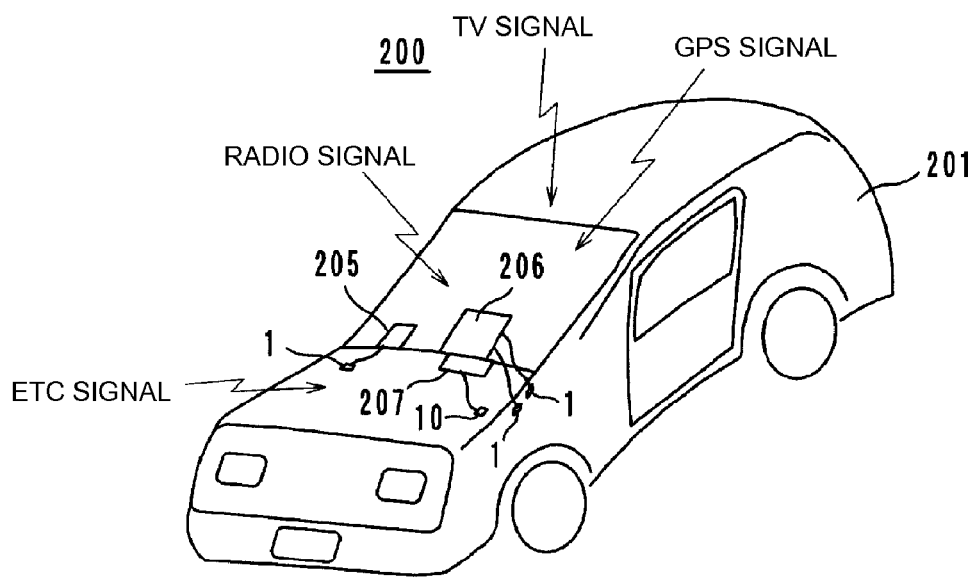
FIG. 41 is a perspective view illustrating a product including a power supply circuit board according to a first preferred embodiment of the present invention.

Refer to FIG. 41

As shown in FIG. 41, a first preferred embodiment preferably is applied to an automobile 200, and a car body 201 of the automobile 200, which is made of a steel plate, for example, is used as a radiation plate. The automobile 200 preferably includes an ETC transmitter/receiver 205, a navigation device 206 including a television set, and a car radio 207. Here, an electromagnetic coupling module 1 which includes a wireless communication circuit board (modem) incorporating reception circuits (and a transmission circuits as needed) which receive signals for the respective devices (such as an ETC signal, a GPS signal, a television signal, and a radio signal) is attached to the steel plate portion of the car body 201, and the power supply circuit is connected to the steel plate portion (radiation plate) through electromagnetic field coupling. The reception circuits (and the transmission circuits as needed) for the respective devices are electrically connected to the wireless communication circuit board.

Note that the first preferred embodiment is applicable not only to the automobile 200 but also to vehicles such as trains, airplanes, ships, buses, construction equipment such as mobile cranes, forklift trucks, motorcycles, and bicycles.

Second Preferred Embodiment

Figure 42:
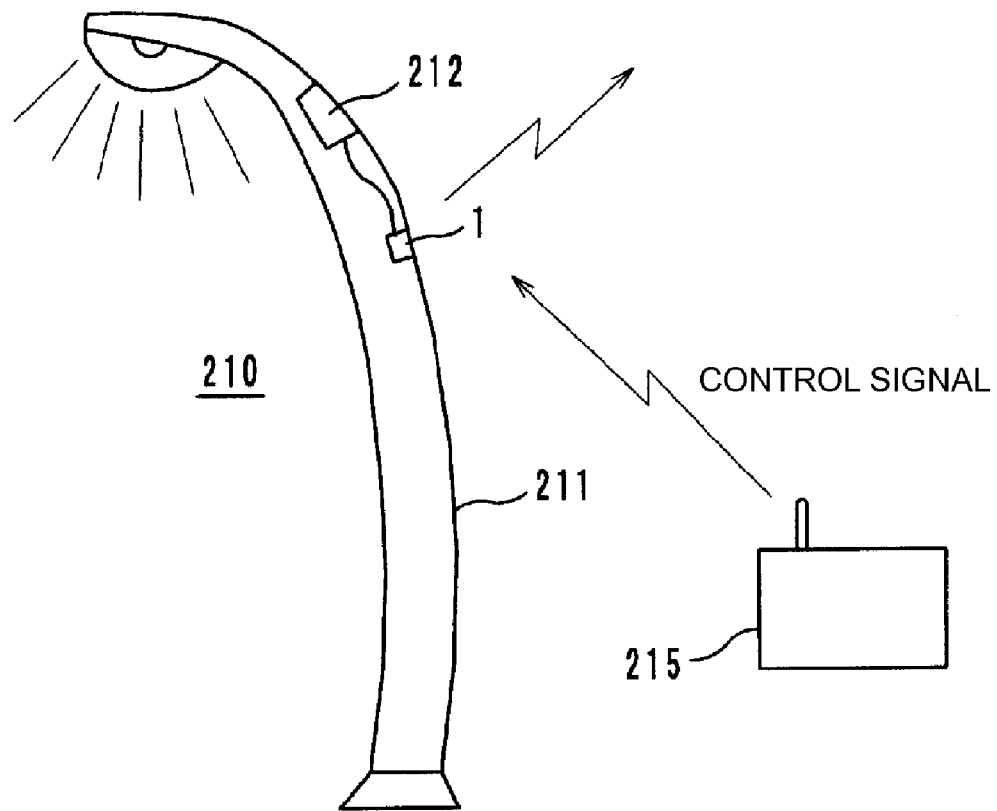
FIG. 42 is a perspective view illustrating a product including a power supply circuit board according to a second preferred embodiment of the present invention.

Refer to FIG. 42

As shown in FIG. 42, a second preferred embodiment is preferably applied to illuminating lamps 210 which are installed in expressways, and metallic pole portions 211 of the illuminating lamps 210 are used as radiation plates. In electromagnetic coupling modules 1, power supply circuits are electromagnetically connected to the pole portions 211, and each of the electromagnetic coupling modules 1 receives a control signal (such as a light-on signal and a light-off signal) transmitted from a controller 215. The control signal is supplied through wireless communication circuit boards (modems) to illumination control units 212 so that light-on operations or light-off operations are performed. Note that the illumination control units 212 may be incorporated in the corresponding wireless communication circuit boards.

The illuminating lamps 210 include Zigbee (registered trademark) systems, for example. Specifically, when one of the illuminating lamps 210, which is located nearest to the controller 215, is controlled, the control signal is successively transferred to other illuminating lamps 210 located near the one of the illuminating lamps 210 so that the illuminating lamps located in distant places are successively controlled.

Third Preferred Embodiment

Figure 43:
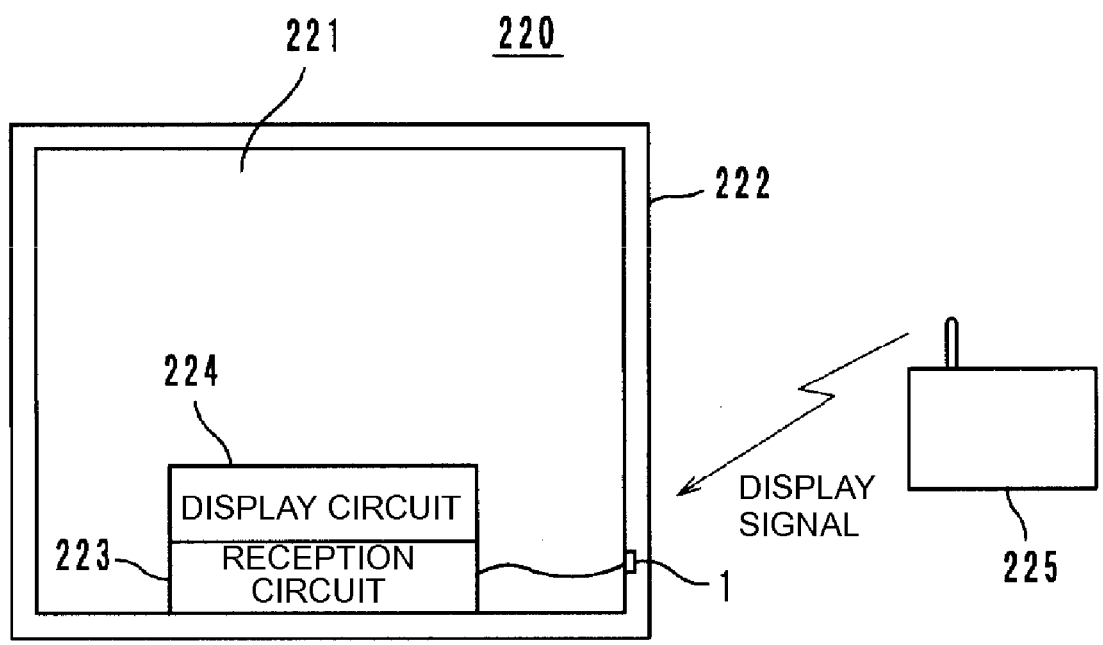
FIG. 43 is a front view illustrating a product including a power supply circuit board according to a third preferred embodiment of the present invention.

Refer to FIG. 43

As shown in FIG. 43, a third preferred embodiment is applied to an electronic paper 220 including a display screen 221 and a frame portion 222, and the metallic frame portion 222 of the electronic paper 220 is used as a radiation plate. A power supply circuit in an electromagnetic coupling module 1 is electromagnetically connected to the frame portion 222, and receives a control signal and a display image signal transmitted from a display signal transmitter 225. The control signal and the display image signal are supplied through a wireless communication board (modem) to a reception circuit 223 and a display circuit 224. Accordingly, an image is displayed in the display screen 221 or is replaced by a new one. Note that the reception circuit 223 may be incorporated in the wireless communication circuit board.

Fourth Preferred Embodiment

Figure 44:
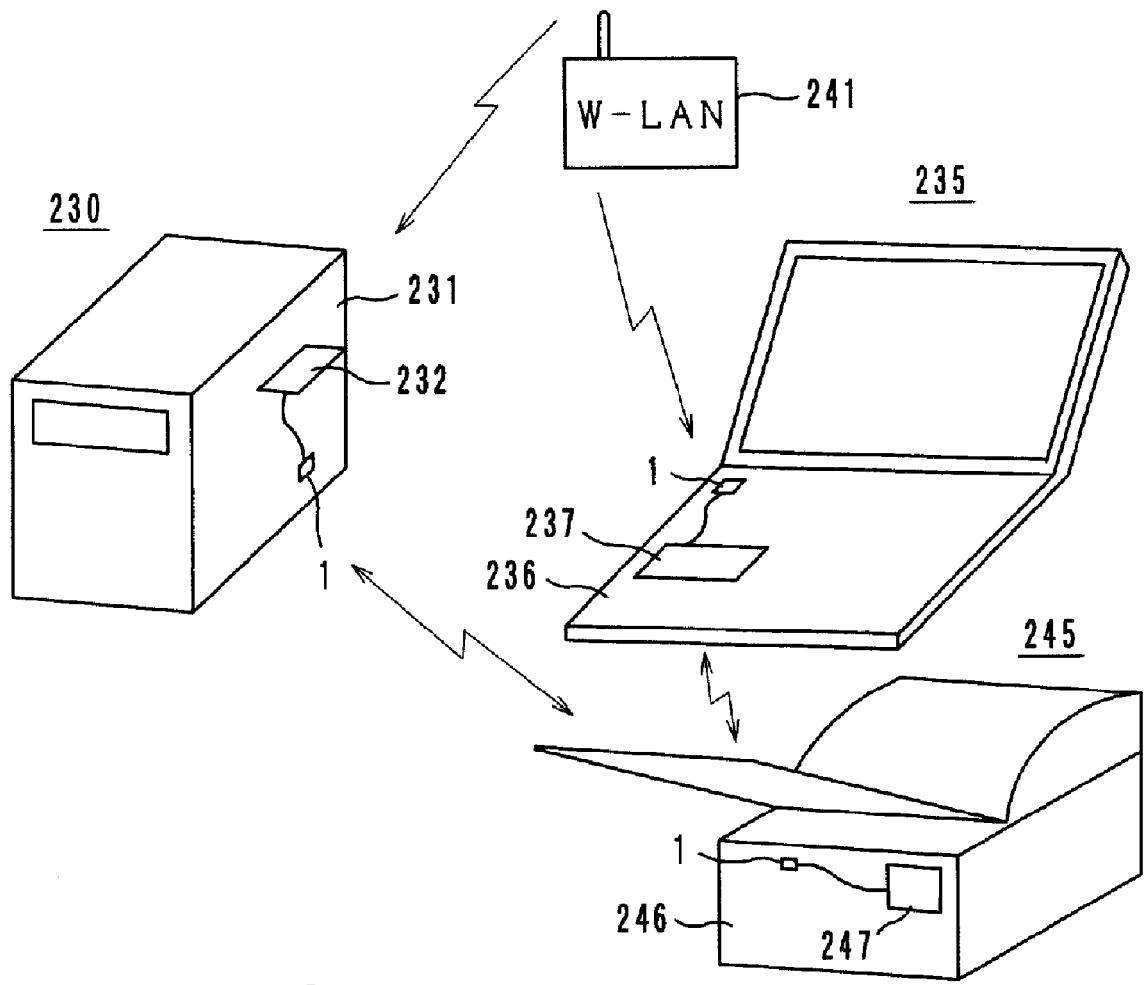
FIG. 44 is a perspective view illustrating a product including a power supply circuit board according to a fourth preferred embodiment of the present invention.

Refer to FIG. 44

As shown in FIG. 44, in a fourth preferred embodiment, a metallic case portion 231 of a body 230 of a desktop personal computer and a metallic case portion 236 of a laptop personal computer 235 are used as radiation plates. Power supply circuits of electromagnetic coupling modules 1 are electromagnetically connected to the case portions 231 and 236, and are connected through wireless communication circuit boards (for example, modems) to transmission/reception circuits 232 and 237. The electromagnetic coupling module 1 receives a signal supplied from a wireless LAN (W-LAN) 241 and transmits a signal to the W-LAN 241.

Alternatively, a case portion 246 of a printer 245 may be used as the radiation plate. In this case, a wireless communication circuit board (for example, a modem) connected to a transmission/reception circuit 247 communicates with the wireless communication circuit boards included in the body 230 and the laptop personal computer 235.

Fifth Preferred Embodiment

Figure 45:
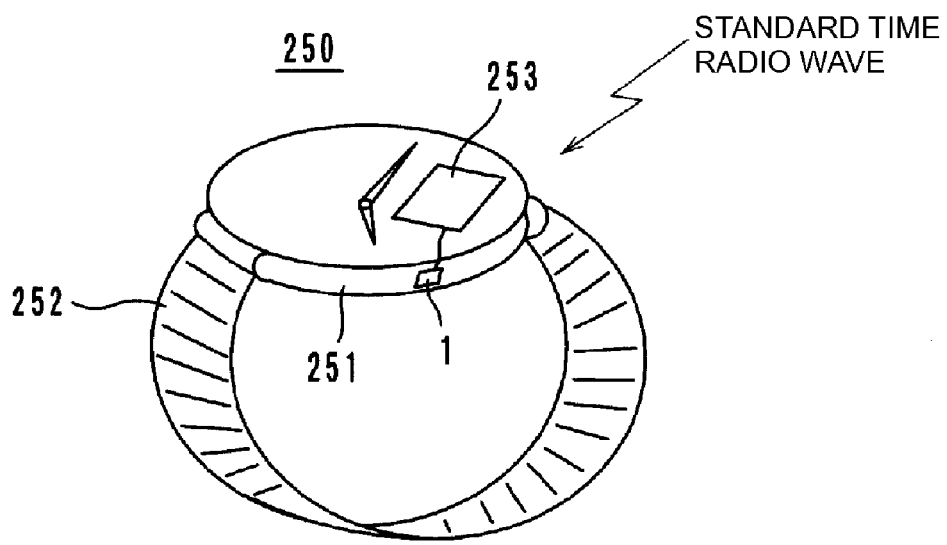
FIG. 45 is a perspective view illustrating a product including a power supply circuit board according to a fifth preferred embodiment of the present invention.

Refer to FIG. 45

As shown in FIG. 45, in a fifth preferred embodiment, a metallic case 251 and a band 252 of an atomic clock 250 are used as a radiation plate. A power supply circuit of an electromagnetic coupling module 1 is electromagnetically connected to the case 251 and the band 252 so that a standard time electric wave is supplied thereto. A wireless communication circuit board (for example, a modem) is connected to a time correction circuit 253. Note that the time correction circuit 253 may be incorporated in the wireless communication circuit board.

Sixth Preferred Embodiment

Figure 46:
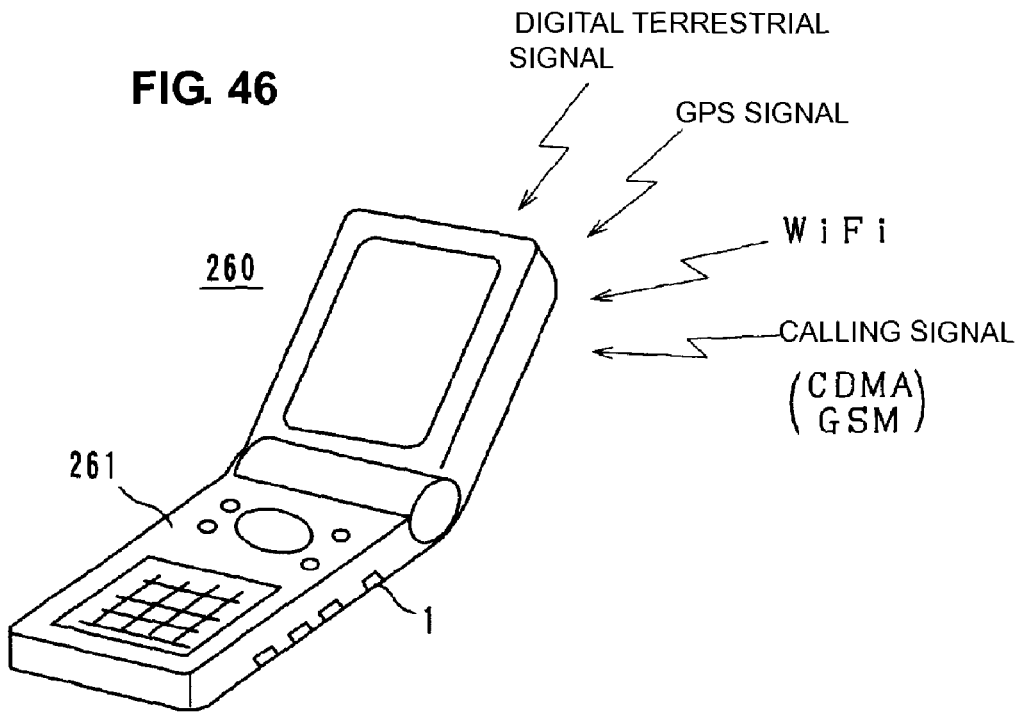
FIG. 46 is a perspective view illustrating a product including a power supply circuit board according to a sixth preferred embodiment of the present invention.

Refer to FIG. 46

As shown in FIG. 46, in a sixth preferred embodiment, a metallic case portion 261 (or a dielectric coating which is applied to the case when the case portion is nonmetallic) of a cellular phone 260 is used as a radiation plate. A electromagnetic coupling module 1 supports a plurality of frequencies, and a power supply circuit is electromagnetically connected to the case portion 261 and the dielectric coating so as to receive c a digital terrestrial signal, a GPS signal, a WiFi signal, and a calling signal such as a CDMA or a GSM. A wireless communication circuit board (for example, a modem) is connected to reception circuits provided for the respective signals.

The sixth preferred embodiment is applicable not only the cellular phone 260 but also mobile devices such as a PDA, a digital still camera, a mobile game device, a communication device, etc.

Seventh Preferred Embodiment

Figure 47:
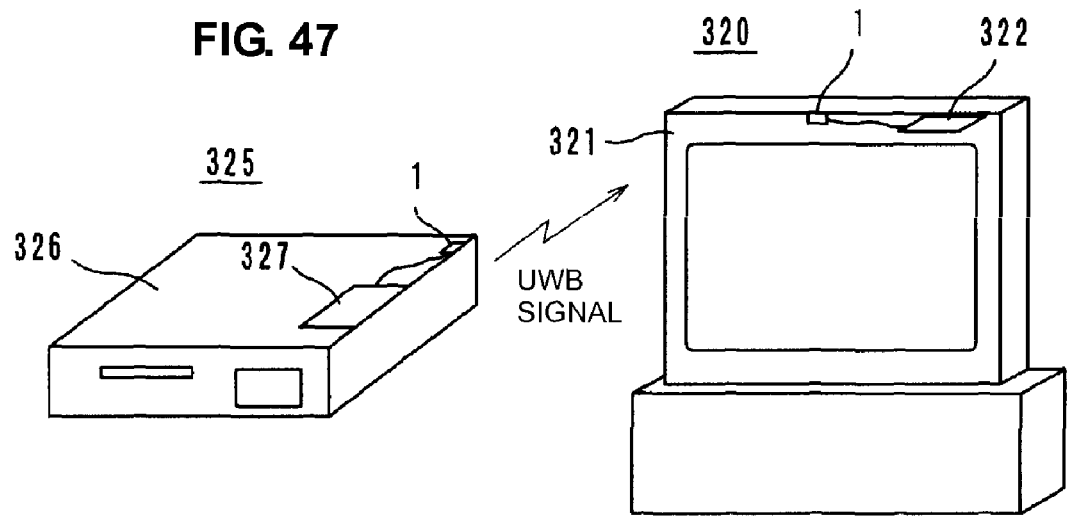
FIG. 47 is a perspective view illustrating a product including a power supply circuit board according to a seventh preferred embodiment of the present invention.

Refer to FIG. 47

As shown in FIG. 47, in a seventh preferred embodiment, a metallic case portion 321 of a television set 320 and a metallic case portion 326 of a DVD recorder 325 are used as radiation plates. Power supply circuits of electromagnetic coupling modules 1 are electromagnetically connected to the respective case portions 321 and 326, and wireless communication circuit boards (for example, modems) of the electromagnetic coupling modules 1 are connected to respective transmission/reception circuits 322 and 327. In the seventh preferred embodiment, the wireless communication circuit boards communicate with each other through UWB communication.

Eighth Preferred Embodiment

Figure 48:
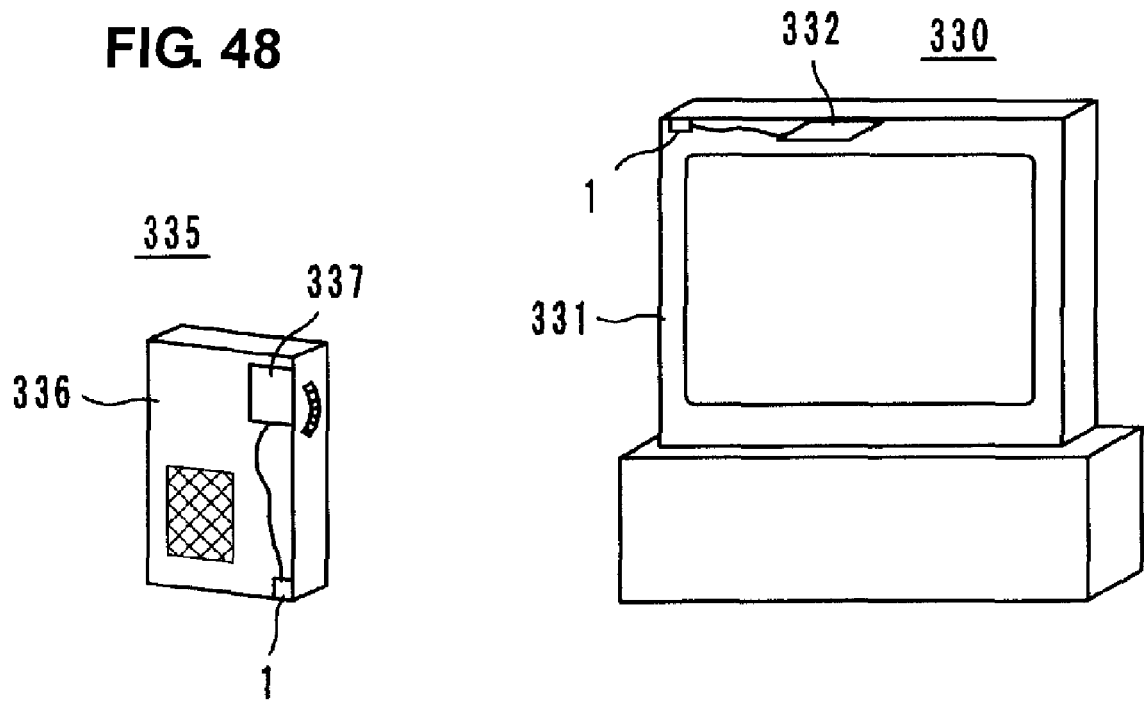
FIG. 48 is a perspective view illustrating a product including a power supply circuit board according to an eighth preferred embodiment of the present invention.

Refer to FIG. 48

As shown in FIG. 48, in an eighth preferred embodiment, a metallic case portion 331 of a television set 330 and a metallic case portion 336 of a radio 335 are used as radiation plates. Electromagnetic coupling modules 1 support a plurality of frequencies, and power supply circuits are electromagnetically connected to either the respective case portions 331 and 336 or a dielectric coating so as to receive a terrestrial television signal and a radio signal. Wireless communication circuit boards (for example, modems) are connected to reception circuits 332 and 337 provided for the respective signals.

Ninth Preferred Embodiment

Figure 49:
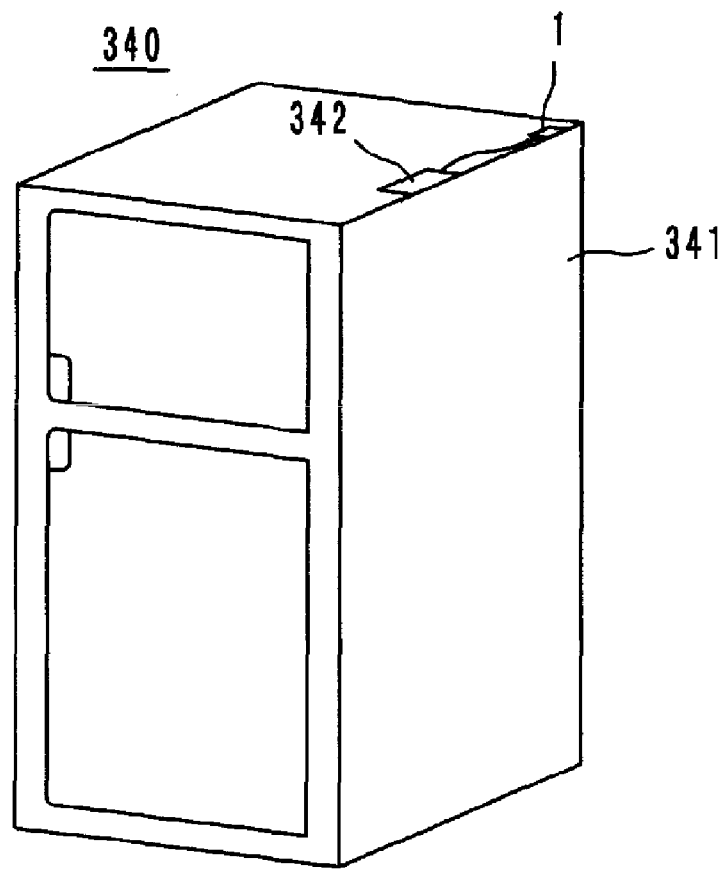
FIG. 49 is a perspective view illustrating a product including a power supply circuit board according to a ninth preferred embodiment of the present invention.

Refer to FIG. 49

As shown in FIG. 49, in a ninth preferred embodiment, a metallic case portion 341 of a refrigerator 340 is used as a radiation plate. A power supply circuit of an electromagnetic coupling module 1 is electromagnetically connected to a case portion 341 and a wireless communication circuit board (for example, a modem) of the electromagnetic coupling module 1 is connected to a transmission/reception circuit 342. In the ninth preferred embodiment, the wireless communication circuit board is wirelessly communicated with a home controller (not shown) based on the Echonet standard, for example, so as to manage foods stored in a refrigerator 340. If electromagnetic coupling modules 1 are attached to the foods stored in the refrigerator 340, use-by dates are easily managed. Since the refrigerator 340 is normally in a turn-on state, the refrigerator 340 is appropriately used as a home server.

Tenth Preferred Embodiment

Figure 50:
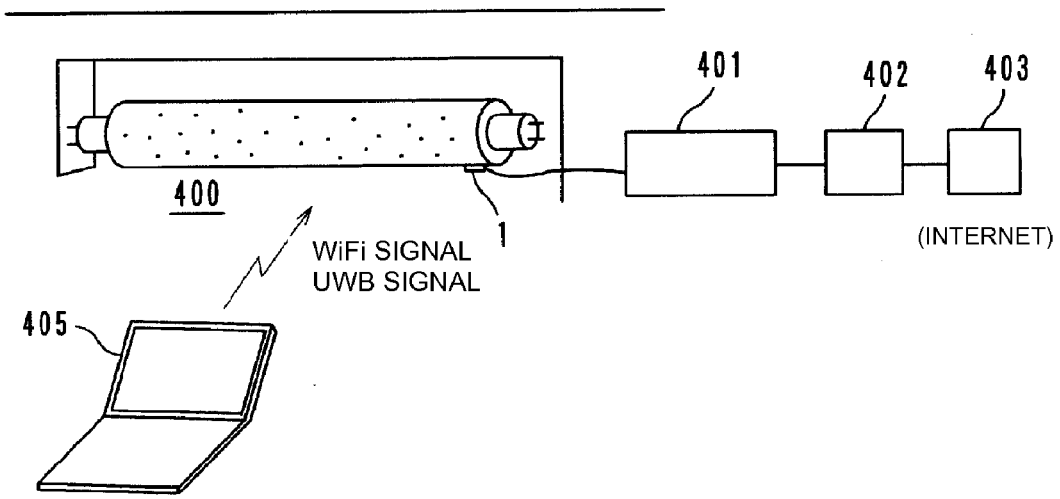
FIG. 50 is a perspective view illustrating a product including a power supply circuit board according to a 10th preferred embodiment of the present invention.
Figure 51:
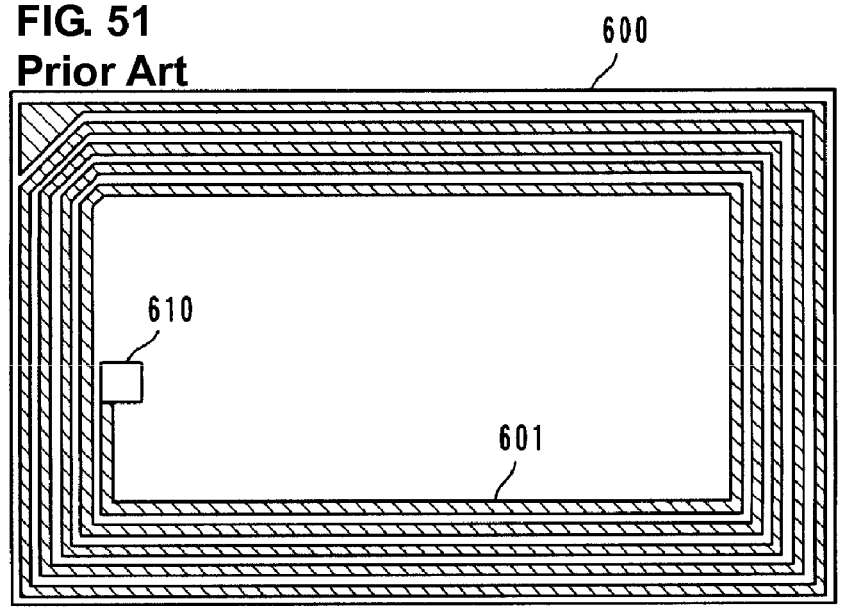
FIG. 51 is a plan view illustrating a first example of a wireless IC device in the conventional art.
Figure 52:
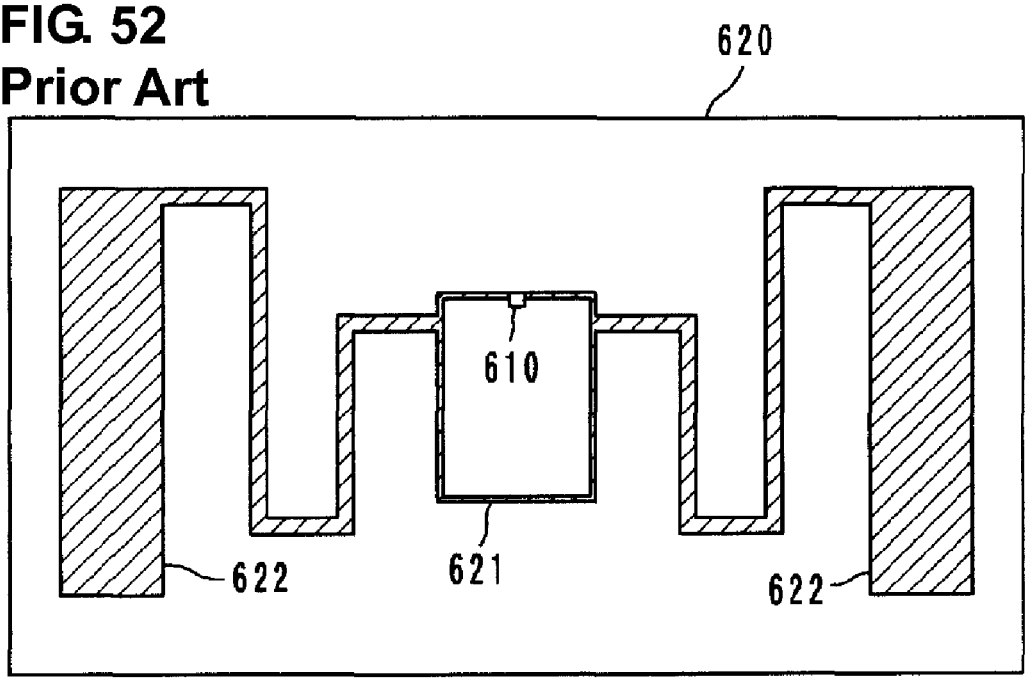
FIG. 52 is a plan view illustrating a second example of the wireless IC device in the conventional art.

Refer to FIG. 50

As shown in FIG. 50, in a tenth preferred embodiment, free electrons filled in a fluorescent light tube 400 are used as radiation plates. A power supply circuit is electromagnetically connected to the free electrons in the tube by attaching an electromagnetic coupling module 1 to a surface of the fluorescent light tube 400. A wireless communication circuit board (for example, a modem) is connected to the Internet through a transmission/reception circuit 401, a PLC 402, and a router 403. A personal computer 405 communicates with the Internet through the electromagnetic coupling module 1 using a WiFi signal and a UWB signal.

In the tenth preferred embodiment, the wireless communication circuit board may store therein location information of the fluorescent light tube 400 in an indoor place, and may transmit the location information to a mobile terminal or a reader/writer device so as to inform a visually impaired person who has the mobile terminal or the reader/writer device of location.

Other Preferred Embodiments

Note that the product including a power supply circuit board according to the present invention is not limited to the foregoing preferred embodiments, and various modifications may be made within the scope of the invention.

In particular, the product to which the power supply circuit board is attached is not limited to the products described in the foregoing preferred embodiments, and the power supply circuit board may be attached to various products. Furthermore, detailed internal configuration of the power supply circuit board and a detailed shape of the radiation plate may be arbitrarily set, and the board may be a rigid board or a flexible board. Moreover, the wireless communication circuit board may be connected to the power supply circuit board not only by a soldering bump but also in other ways.

As described above, the present invention is applicable to product used in RFID systems, and the present invention is excellent in providing a stable frequency characteristic and capability of communication between various products.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A product comprising:
a product body;
a power supply circuit board including a power supply circuit including an inductance element; and
a wireless communication circuit board which is electrically connected to the power supply circuit; wherein
one of the power supply circuit board and the wireless communication circuit board is mounted on the other, or the power supply circuit board and the wireless communication circuit board are integrally formed as single board, and the other board or the integrally formed board is mounted on the product body;
the product includes a radiation plate arranged to perform at least one of a function of emitting a transmission signal which is supplied from the power supply circuit through electromagnetic field coupling and which has a frequency substantially determined by a resonant frequency of the power supply circuit, and a function of supplying a reception signal to the power supply circuit through the electromagnetic field coupling; and
the power supply circuit board has a multi-layered structure including a plurality of layers, and the inductance element is provided within the power supply circuit board and has a coil shape that extends to at least two of the plurality of layers.

2. The product according to claim 1, wherein the radiation plate is a metallic member included in the product body.

3. The product according to claim 1, wherein the radiation plate is a metallic plate which is disposed on the product body.

4. The product according to claim 1, wherein the power supply circuit is a lumped constant resonant circuit including a capacitance element and the inductance element.

5. The product according to claim 4, wherein the lumped constant resonant circuit is an LC series resonant circuit or an LC parallel resonant circuit.

6. The product according to claim 5, wherein the lumped constant resonant circuit includes a plurality of LC series resonant circuits or a plurality of IC parallel resonant circuits.

7. The product according to claim 4, wherein the capacitance element is arranged between the wireless communication circuit board and the inductance element.

8. The product according to claim 4, wherein the power supply circuit board is a multilayer board including a plurality of dielectric layers or magnetic layers laminated to one another, and the capacitance element is arranged either on a surface of the multilayered structure or inside the multilayered structure.

9. The product according to claim 1, wherein the power supply circuit board is either a rigid resin board or a rigid ceramic board.

10. The product according to claim 1, wherein the radiation plate is an electrode having a band shape, and a length of the band shaped electrode is equal to an integral multiple of a half wavelength of a resonant frequency.

11. The product according to claim 1, wherein an electrode on a wireless communication circuit board side is arranged on the wireless communication circuit board, an electrode on a first board side is arranged on the power supply circuit board, and the wireless communication circuit board and the power supply circuit board are electrically connected to each other so that the electrode on the wireless communication circuit board side and the electrode on the first board side are electrically connected to each other.

12. The product according to claim 1, wherein an electrode on a wireless communication circuit board side is arranged on the wireless communication circuit board, an electrode on a first board side is arranged on the power supply circuit board, and the wireless communication circuit board and the power supply circuit board are electrically connected to each other by capacitance coupling generated between the electrode on the wireless communication circuit board side and the electrode on the first board side.

13. The product according to claim 12, wherein the electrode on the wireless communication circuit board side and the electrode on the first board side are flat electrodes arranged substantially parallel to each other, and the wireless communication circuit board and the power supply circuit board are attached to each other through a dielectric adhesive layer.

14. The product according to claim 1, wherein an electrode on a wireless communication circuit board side is arranged on the wireless communication circuit board, an electrode on a first board side is arranged on the power supply circuit board, and the wireless communication circuit board and the power supply circuit board are electrically connected to each other by magnetic field coupling generated between the electrode on the wireless communication circuit board side and the electrode on the first board side.

15. The product including the power supply circuit board according to claim 14, wherein the electrode on the wireless communication circuit board side and the electrode on the first board side are electrodes having coil shapes, and the wireless communication circuit board and the power supply circuit board are attached to each other through an insulation adhesive layer or a magnetic adhesive layer.

16. The product including the power supply circuit board according to claim 1, wherein an electrode on a second board side is arranged on the power supply circuit board, and the power supply circuit board and the radiation plate are connected to each other through capacitance coupling generated between the electrode on the second board side and the radiation plate.

17. The product including the power supply circuit board according to claim 16, wherein the electrode on the second board side is a flat electrode arranged substantially parallel to the radiation plate, and the power supply circuit board and the radiation plate are attached to each other through a dielectric adhesive layer.

18. The product according to claim 1, wherein an electrode on a second board side is arranged on the power supply circuit board, and the power supply circuit board and the radiation plate are connected to each other through magnetic field coupling generated between the electrode on the second board side and the radiation plate.

19. The product including the power supply circuit board according to claim 18, wherein the electrode on the second board side is an electrode having a coil shape, and the power supply circuit board and the radiation plate are attached to each other through an insulation adhesive layer or a magnetic adhesive layer.

* * * * *